United States Patent
Takishita et al.

(10) Patent No.: US 10,436,959 B2
(45) Date of Patent: *Oct. 8, 2019

(54) COMPOSITION FOR COLOR FILTER, INFRARED TRANSMISSION FILTER AND PRODUCTION METHOD THEREOF, AND INFRARED SENSOR

(71) Applicant: FUJIFILM Corporation, Minato-ku, Tokyo (JP)

(72) Inventors: Hirotaka Takishita, Shizuoka (JP); Yoshinori Taguchi, Shizuoka (JP); Hiroshi Taguchi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/917,063

(22) Filed: Mar. 9, 2018

(65) Prior Publication Data

US 2018/0196177 A1    Jul. 12, 2018

Related U.S. Application Data

(63) Continuation of application No. 14/749,774, filed on Jun. 25, 2015, now Pat. No. 9,915,765, which is a continuation of application No. PCT/JP2013/082477, filed on Dec. 3, 2013.

(30) Foreign Application Priority Data

Dec. 27, 2012  (JP) ................... 2012-286367

(51) Int. Cl.
*G02B 5/20* (2006.01)
*G03F 7/004* (2006.01)
*G03F 7/00* (2006.01)
*G03F 7/105* (2006.01)
*G01J 5/08* (2006.01)

(52) U.S. Cl.
CPC ............ *G02B 5/208* (2013.01); *G01J 5/0803* (2013.01); *G03F 7/0007* (2013.01); *G03F 7/105* (2013.01)

(58) Field of Classification Search
CPC .......... G02B 5/208; G02B 5/223; G03F 7/105
USPC ............................................. 430/7
See application file for complete search history.

(56) References Cited

U.S. PATENT DOCUMENTS

| | | | |
|---|---|---|---|
| 6,503,937 B1 | 1/2003 | Nesvadba et al. | |
| 9,915,765 B2 * | 3/2018 | Takishita | G02B 5/208 |
| 2002/0121228 A1 | 9/2002 | Zama et al. | |
| 2003/0030041 A1 | 2/2003 | Genjima et al. | |
| 2003/0121113 A1 | 7/2003 | Nesvadba et al. | |
| 2003/0176124 A1 | 9/2003 | Koike et al. | |
| 2007/0071970 A1 | 3/2007 | Koike et al. | |
| 2010/0186891 A1 | 7/2010 | Ruch et al. | |
| 2010/0203098 A1 | 8/2010 | Kleinschmidt | |
| 2010/0243970 A1 | 9/2010 | Toshimitsu et al. | |
| 2011/0294051 A1 | 12/2011 | Sultemeyer et al. | |
| 2011/0294385 A1 | 12/2011 | Eichenberger et al. | |
| 2012/0092598 A1 | 4/2012 | Kyrlidis et al. | |
| 2012/0172498 A1 | 7/2012 | Fontana et al. | |
| 2013/0048357 A1 | 2/2013 | Ueta et al. | |
| 2014/0145126 A1 | 5/2014 | Suemitsu | |
| 2014/0360758 A1 | 12/2014 | Ueta et al. | |
| 2015/0147493 A1 | 5/2015 | Ruch et al. | |
| 2015/0183955 A1 | 7/2015 | Deno | |

FOREIGN PATENT DOCUMENTS

| | | |
|---|---|---|
| CN | 1324355 A | 11/2001 |
| CN | 1361206 A | 7/2002 |
| CN | 1462237 A | 12/2003 |
| CN | 101688935 A | 3/2010 |
| CN | 101827526 A | 9/2010 |
| CN | 102186931 A | 9/2011 |
| CN | 102279522 A | 12/2011 |
| EP | 1 219 684 A1 | 7/2002 |
| JP | 2-239204 A | 9/1990 |
| JP | 9-184912 A | 7/1997 |
| JP | 11-273439 A | 10/1999 |
| JP | 2002-060698 A | 2/2002 |
| JP | 2002-256165 A | 9/2002 |
| JP | 2002-528448 A | 9/2002 |
| JP | 2006-233014 A | 9/2006 |
| JP | 2009-69822 A | 4/2009 |
| JP | 2010-534726 A | 11/2010 |
| JP | 2011-075678 A | 4/2011 |
| JP | 2012-18384 A | 1/2012 |
| JP | 2012-68613 A | 4/2012 |

(Continued)

OTHER PUBLICATIONS

Office Action dated Jul. 17, 2018, from the State Intellectual Property Office of the People's Republic of China in counterpart Chinese Application No. 201380068182.X.
Office Action dated Oct. 2, 2018, by the Japanese Patent Office in counterpart Japanese Patent Application No. 2017-041118.
Communication dated Nov. 29, 2016 issued by Japanese Intellectual Property Office in counterpart Japanese Application No. 2012-236367.

(Continued)

*Primary Examiner* — John A McPherson

(74) *Attorney, Agent, or Firm* — Sughrue Mion, PLLC

(57) ABSTRACT

By a composition for color filter containing a near-infrared transmitting black coloring agent, a composition for color filter capable of forming an infrared transmission filter which is able to transmit an infrared ray (particularly, a near infrared ray) in the state of low noise derived from the visible light component even when it has a very thin thickness (for example, thickness of 0.5 μm), and an infrared transmission filter and a production method of an infrared transmission filter using the same, and an infrared sensor can be provided.

21 Claims, No Drawings

(56) References Cited

FOREIGN PATENT DOCUMENTS

| JP | 2012-515234 A | 7/2012 |
|---|---|---|
| JP | 2012-515240 A | 7/2012 |
| JP | 2015-525260 A | 9/2015 |
| KR | 10-2010-0055356 A | 5/2010 |
| KR | 10-2010-0132846 A | 12/2010 |
| KR | 10-2011-0108397 A | 10/2011 |
| TW | 200925777 A | 6/2009 |
| TW | 201221584 A | 6/2012 |
| WO | 00-24736 A1 | 5/2000 |
| WO | 2009/025297 A1 | 2/2009 |
| WO | 2010/044393 A1 | 4/2010 |
| WO | 2012/091083 A1 | 7/2012 |
| WO | 2012/169506 A1 | 12/2012 |
| WO | 2013/179237 A1 | 12/2013 |

OTHER PUBLICATIONS

Computer-generated translation of JP 2012-068613 (Apr. 2012).
Computer-generated translation of JP 2006-233014 (Sep. 2004).
Communication dated Aug. 15, 2017, from the State Intellectual Property Office of People's Republic of China in counterpart Chinese Application No. 201380068182.X.
Communication dated Dec. 29, 2016 issued by Korean Intellectual Property Office in counterpart Korean Application No. 10-2015-7010672.
Communication dated Apr. 26, 2016, issued by the Japanese Patent Office in counterpart Japanese Patent Application No. 2012-286367.
Communication dated Jun. 28, 2016, issued by the Korean Intellectual Property Office in counterpart Korean Patent Application No. 10-2015-7010672.
Communication dated Feb. 2, 2016 by the European Patent Office in related EP Application No. 13869068.0.
Int. Search Report dated Feb. 10, 2014 issued in Int. Application No. PCT/JP2013/082477 (PCT/ISA/210).
Office Action dated Jan. 25, 2017 issued by the State Intellectual Property Office of P.R. China in counterpart Chinese Patent Application No. 201380068182.X.
Office Action dated Apr. 13, 2017 issued by the Taiwan Intellectual Property Office in counterpart Taiwanese Patent Application No. 102148512.
Office Action issued by Taiwanese Intellectual Property Office dated Jan. 11, 2017 in counterpart Taiwanese Patent Application No. 10620033690.
Office Action dated Apr. 21, 2017, by the Korean Intellectual Property Office in counterpart Korean Application No. 10-2015-7010672.
Office Action dated Aug. 3, 2016, by the State Intellectual Property Office in counterpart Chinese Application No. 201380068182.X.
Office Action dated Jul. 31, 2017 by the Taiwanese Patent Office in counterpart Taiwanese Application No. 102148512.
Written Opinion dated Feb. 10, 2014 issued in Int. Application No. PCT/JP2013/082477 (PCT/ISA/237).
Written Opinion dated Feb. 10, 2014, issued by the International Searching Authority in counterpart International Application No. PCT/JP2013/082477.
Office Action dated Apr. 2, 2018, issued by the Korean Intellectual Property Office in corresponding Korean Application No. 10-2018-7002439.
Office Action dated Feb. 20, 2018 in counterpart Japanese Application No. 2017-041118.
Office Action dated May 7, 2019, from the Japanese Patent Office in counterpart Japanese application No. 2018-080597.

\* cited by examiner

COMPOSITION FOR COLOR FILTER, INFRARED TRANSMISSION FILTER AND PRODUCTION METHOD THEREOF, AND INFRARED SENSOR

CROSS REFERENCE TO RELATED APPLICATION

This is a Continuation of U.S. application Ser. No. 14/749,774, filed Jun. 25, 2015, which is a continuation of International Application No. PCT/JP2013/082477 filed on Dec. 3, 2013, and claims priority from Japanese Patent Application No. 2012-286367 filed on Dec. 27, 2012, the entire disclosures of which are incorporated therein by reference.

TECHNICAL FIELD

The present invention relates to a composition for color filter, an infrared transmission filter and a production method thereof, and an infrared sensor.

BACKGROUND ART

A color filter is an essential component of a solid-state imaging device or a liquid crystal display. In particular, as to a color filter for solid-state imaging device, improvement in color separation property and improvement in color reproducibility have been required.

Such a color filter is formed with colored regions (colored cured film) of plural hues and usually formed with at least red, green and blue colored regions (hereinafter, also refer to as "colored pattern" or "colored pixel"). In a method for forming a colored pattern, first, as to a first hue, a colored radiation-sensitive composition containing any of red, green and blue coloring agents is coated, followed by performing exposure, development and, if desired, heat treatment to form a colored pattern of the hue and then, as to a second hue and a third hue, the same processes of coating, exposure, development and, if desired, heat treatment are repeated.

As the coloring agent in the color filter, a pigment has been widely used because of having clear color tone and high coloring power, and in particular, it is preferred to use a pigment miniaturized and exhibiting a preferable color separation property.

Also, in a solid-state imaging device, it is required recently to miniaturize a colored pixel (for example, a colored pattern having one side of 1.0 µm or less) for the purpose of improving resolution, but it is known that noise increases with the miniaturization of the colored pixel.

The solid-state imaging device is utilized as a light sensor in various uses.

For example, a near infrared ray is hardly scattered because of having a long wavelength in comparison with visible light and it is also possible to utilize in distance measurement, three-dimensional measurement and the like. Also, since the near infrared ray is not visible to the eyes of human, animal and the like, when a subject is irradiated with a near-infrared light source at night, the subject does not notice the irradiation so that it can be used for shooting a nocturnal wild animal or for security without stimulating the subject. A light sensor sensing such a near infrared ray is capable of expansion in various uses, and development of a color filter which can be used in a solid-state imaging device sensing the near infrared ray has been awaited.

For example, a resin black matrix which has a small light absorption in a wavelength region from near infrared to infrared and has a high light transmittance in this wavelength region is known (for example, Patent Document 1), but transmission in the near infrared region is still insufficient and it is difficult to be used as an infrared transmission filter in an infrared sensor for detecting the near infrared region.

Also, an infrared transmission filter having a very thin thickness (for example, thickness of 0.5 µm) has been requested in recent years. However, as the thickness is decreased, a light-shielding property to visible light of the infrared transmission filter is apt to decrease (that is, noise derived from the visible light component is apt to generate) and as a result, a problem arises in that the performance of the infrared sensor is deteriorated.

PRIOR ART DOCUMENT

Patent Document

Patent Document 1: JP-A-2009-69822

DISCLOSURE OF THE INVENTION

Problems that the Invention is to Solve

The present invention has been made in view of the circumstances described above, and the problem of the invention is to achieve the objects described below.

Specifically, an object of the invention is to provide a composition for color filter capable of forming an infrared transmission filter which is able to transmit an infrared ray (particularly, a near infrared ray) in the state of low noise derived from the visible light component even when it has a very thin thickness (for example, thickness of 0.5 µm), and an infrared transmission filter and a production method of an infrared transmission filter using the same, and an infrared sensor.

Means for Solving the Problems

As a result of the intensive investigations in view of the circumstances described above, the inventors have found that an infrared transmission filter formed by using a composition for color filter containing a near-infrared transmitting black coloring agent can achieve the problem described above to complete the invention.

Specifically, the present invention includes the followings.

[1] A composition for color filter containing a near-infrared transmitting black coloring agent.
[2] The composition for color filter as described in [1], which further contains a photopolymerization initiator and a polymerizable compound.
[3] The composition for color filter as described in [1] or [2], wherein the near-infrared transmitting black coloring agent is one or more selected from the group consisting of a bisbenzofuranone-based pigment, an azomethine-based pigment, a perylene-based pigment and an azo-based dye.
[4] The composition for color filter as described in any one of [1] to [3],
wherein when a film having a film thickness of 0.5 µm is formed, a standard deviation of a light transmittance in the film thickness direction in a wavelength range from 400 to 630 nm is 6.0 or less.
[5] The composition for color filter as described in any one of [1] to [4],
wherein as the near-infrared transmitting black coloring agent, a near-infrared transmitting black pigment is contained, and an average particle size of the near-infrared transmitting black pigment is 50 nm or less.

[6] The composition for color filter as described in any one of [1] to [5], wherein when a film having a film thickness of 0.5 μm is formed, a maximum value of a light transmittance in the film thickness direction in a wavelength range from 400 to 650 nm is 20% or less and a minimum value of a light transmittance in the film thickness direction in a wavelength range from 800 to 1,300 nm is 80% or more.

[7] The composition for color filter as described in any one of [1] to [6], which further contains a polymer dispersant, and the polymer dispersant is one or more selected from the group consisting of a resin having an acid value of 60 mgKOH/g or more, a resin containing an amine group and an oligoimine-based resin.

[8] The composition for color filter as described in any one of [1] to [7], which further contains a coloring agent different from the near-infrared transmitting black coloring agent

[9] An infrared transmission filter formed from the composition for color filter as described in any one of [1] to [8].

[10] A production method of infrared transmission filter comprising:

a step of providing the composition for color filter as described in any one of [1] to [8] on a substrate to form an infrared transmission composition layer, a step of exposing patternwise the infrared transmission composition layer, and a step of developing the exposed infrared transmission composition layer to form a pattern.

[11] An infrared sensor comprising the infrared transmission filter as described in [9] or an infrared transmission filter obtained by the production method of infrared transmission filter as described in [10].

Advantage of the Invention

According to the invention, a composition for color filter capable of forming an infrared transmission filter which is able to transmit an infrared ray (particularly, a near infrared ray) in the state of low noise derived from the visible light component even when it has a very thin thickness (for example, thickness of 0.5 μm), and an infrared transmission filter and a production method of an infrared transmission filter using the same, and an infrared sensor can be provided.

MODE FOR CARRYING OUT THE INVENTION

The invention will be described in detail hereinafter.

The description of the constituent element below is made based on the typical embodiment of the invention in some cases, but the invention should not be construed as being limited thereto. In the specification, a numerical value range represented by using the term "to" means a range which includes the numerical values described before and after the term "to" as a lower limit and an upper limit, respectively.

The composition for color filter according to the invention contains a near-infrared transmitting black coloring agent.

The composition for color filter according to the invention is typically a black composition, and is also referred to as a near-infrared transmission composition because it transmits a near infrared ray.

Each component constituting the composition according to the invention will be described below.

<(A) Near-Infrared Transmitting Black Coloring Agent>

The composition for color filter according to the invention contains a near-infrared transmitting black coloring agent, as described above.

According to the composition for color filter of the invention, an infrared transmission filter which is able to transmit an infrared ray (particularly, a near infrared ray) in the state of low noise derived from the visible light component even when it has a very thin thickness (for example, thickness of 0.5 μm) can be formed.

The near-infrared transmitting black coloring agent in the composition for color filter according to the invention is a coloring agent which selectively transmits a near infrared ray, is preferably a coloring agent which when a film having a film thickness of 0.5 μm and concentration of itself (near-infrared transmitting black coloring agent) of 60% by mass based on the total solid content is formed by the composition for color filter, a maximum value of a light transmittance in the film thickness direction in a wavelength range from 400 to 650 nm is able to set 30% or less and a minimum value of a light transmittance in the film thickness direction in a wavelength range from 800 to 1,300 nm is able to set 80% or more, and is particularly preferably a coloring agent which the maximum value of a light transmittance in the film thickness direction in a wavelength range from 400 to 650 nm is able to set 20% or less and the minimum value of a light transmittance in the film thickness direction in a wavelength range from 800 to 1,300 nm is able to set 80% or more.

A method for measuring spectral characteristics, a film thickness and the like of the layer formed from the composition according to the invention is described below.

The composition according to the invention is coated on a glass substrate by a method, for example, spin coating so as to have a film thickness after drying of 0.5 μm to provide a film and dried on a hot plate at 100° C. for 120 seconds.

The film thickness of the film was measured using the substrate having the film after drying by a stylus type surface profile measuring instrument (DEKTAK 150 produced by ULVAC Inc.).

The transmittance was measured in a wavelength range from 300 to 1,300 using the substrate having the film after drying by an ultraviolet visible near-infrared spectrophotometer (U-4100 produced by Hitachi High-Technologies Corp) (ref glass substrate).

The near-infrared transmitting black coloring agent may be a near-infrared transmitting black pigment or a near-infrared transmitting black dye, and is preferably near-infrared transmitting black pigment.

As the near-infrared transmitting black pigment, for example, a bisbenzofuranone-based pigment, an azomethine-based pigment and a perylene-based pigment are preferably exemplified.

As the near-infrared transmitting black dye, for example, an azo-based dye is preferably exemplified.

More specifically, the near-infrared transmitting black coloring agent is preferably one or more selected from the group consisting of a bisbenzofuranone-based pigment, an azomethine-based pigment, a perylene-based pigment and an azo-based dye, more preferably one or more selected from the group consisting of a bisbenzofuranone-based pigment, an azomethine-based pigment and an azo-based dye, and still more preferably a bisbenzofuranone-based pigment.

As the bisbenzofuranone-based pigment, those described, for example, in JP-T-2012-528448, JP-T-2010-534726 and JP-T-2012-515234 are exemplified, and it is available, for example, as IRGAPHOR BK produced by BASF Corp.

As the azomethine-based pigment, those described, for example, in JP-A-1-170601 and JP-A-2-34664 are exemplified, and it is available, for example, as CHROMOFINE BLACK A1103 produced by Dainichiseika Color & Chemicals Mfg. Co., Ltd.

The azo dye is not particularly limited and, for example, a compound represented by formula (A-1) shown below is preferably exemplified.

[Chem. 1]

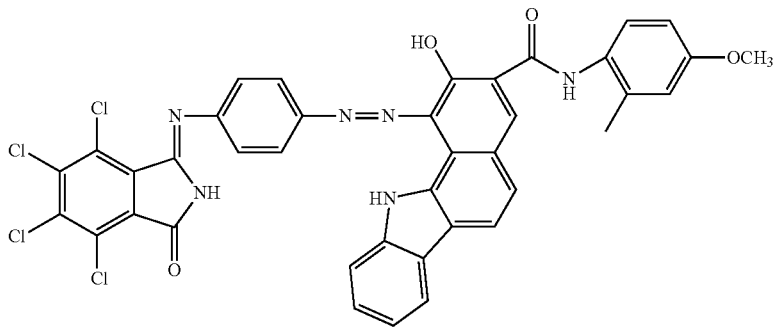

CHROMOFINE BLACK A1103

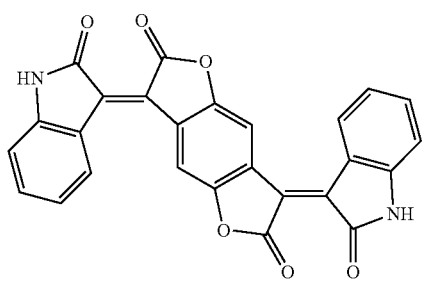

IRGAPHOR BK

The composition for color filter according to the invention preferably contains a near-infrared transmitting black pigment as the near-infrared transmitting black coloring agent. In this case, the average particle size of the near-infrared transmitting black pigment is preferably 50 nm or less, and more preferably 30 nm or less. The average particle size of the near-infrared transmitting black pigment is usually 1 nm or more.

The average particle size of the pigment in the specification is based on measurement using MICROTRAC UPA 150 produced by Nikkiso Co., Ltd.

The content of the near-infrared transmitting black coloring agent is preferably from 20 to 80% by mass, more preferably from 40 to 80% by mass, based on the total solid content of the composition for color filter according to the invention.

<(B) Coloring Agent>

The composition for color filter according to the invention may contain (B) a coloring agent which is different from the near-infrared transmitting black coloring agent described above.

As the coloring agent (B), a pigment, a dye and the like are exemplified.

The pigment is preferably an organic pigment, and those set forth below are exemplified, but the invention should not be construed as being limited thereto.

C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214 and the like (as yellow pigment), C. I. Pigment Orange 2, 5, 13, 16, 17:1, 31, 34, 36, 38, 43, 46, 48, 49, 51, 52, 55, 59, 60, 61, 62, 64, 71, 73 and the like (as orange pigment), C. I. Pigment Red 1, 2, 3, 4, 5, 6, 7, 9, 10, 14, 17, 22, 23, 31, 38, 41, 48:1, 482, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279 and the like (as red pigment), C. I. Pigment Green 7, 10, 36, 37, 58 and the like (as green pigment), C. I. Pigment Violet 1, 19, 23, 27, 32, 37, 42 and the like (as purple pigment), C. I. Pigment Blue 1, 2, 15, 15:1, 15:2, 15:3, 15:4, 15:6, 16, 22, 60, 64, 66, 79, 80 and the like (as blue pigment), C. I. Pigment Black 1, 7, 31, 32, LUMOGEN BLACK FK4280 (produced by BASF Corp.), LUMOGEN BLACK FK 4281 (produced by BASF Corp.) and the like (as black pigment).

The organic pigments may be used individually or in combination of various kinds thereof.

The dye is not particularly limited, and a dye conventionally known for a color filter can be used.

As to the chemical structure, a dye, for example, pyrazole azo-based dye, anilino azo-based dye, triphenylmethane-based dye, anthraquinone-based dye, anthrapyridone-based dye, benzylidene-based dye, oxonol-based dye, pyrazolotriazole azo-based dye, pyridone azo-based dye, cyanine-based dye, phenothiazine-based dye, pyrrolopyrazole azomethine-based dye, xanthenes-based dye, phthalocyanine-based dye, benzopyran-based dye, indigo-based dye or pyrromethene-based dye can be used. Also, multimers of these dyes may be used.

Further, there is a case where an acid dye and/or a derivative thereof can be preferably used as the dye.

In addition, a direct dye, a basic dye, a mordant dye, an acid mordant dye, an azoic dye, a disperse dye, an oil-soluble dye, a food dye and/or a derivative thereof may also be usefully used.

Specific examples of the acid dye are set forth below, but the invention should not be construed as being limited thereto.

For example, Acid Alizarin Violet N; Acid Black 1, 2, 24 and 48; Acid Blue 1, 7, 9, 15, 18, 23, 25, 27, 29, 40 to 45, 62, 70, 74, 80, 83, 86, 87, 90, 92, 103, 112, 113, 120, 129, 138, 147, 158, 171, 182, 192, 243 and 324:1; Acid Chrome Violet K; Acid Fuchsin; Acid Green 1, 3, 5, 9, 16, 25, 27 and 50; Acid Orange 6, 7, 8, 10, 12, 50, 51, 52, 56, 63, 74 and 95; Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266 and 274; Acid Violet 6B, 7, 9, 17 and 19; Acid Yellow 1, 3, 7, 9, 11, 17, 23, 25, 29, 34, 36, 42, 54, 72, 73, 76, 79, 98, 99, 111, 112, 114, 116, 184 and 243; Food Yellow 3; and derivatives of these dyes are exemplified.

Further, an azo-based, xanthenes-based or phthalocyanine-based acid dyes other than those described above are also preferred, and an acid dye, for example, C. I. Solvent Blue 44 and 38; C. I. Solvent Orange 45; Rhodamine B or Rhodamine 110 and derivatives of these dyes are preferably used.

Among them, as the dye, a coloring agent selected from a triarylmethane-based dye, an anthraquinone-based dye, an azomethine-based dye, a benzylidene-based dye, an oxonol-based dye, a cyanine-based dye, a phenothiazine-based dye, a pyrrolopyrazole azomethine-based dye, a xanthenes-based dye, a phthalocyanine-based dye, a benzopyran-based dye, an indigo-based dye, a pyrazole azo-based dye, an anilino azo-based dye, a pyrazolotriazole azo-based dye, a pyridone azo-based dye, an anthrapyridone-based dye and a pyrromethene-based dye is preferred.

Moreover, a pigment and a dye may be used in combination.

The content of the coloring agent (B) is preferably from 1 to 60% by mass, more preferably from 1 to 30% by mass, based on the total solid content of the composition for color filter according to the invention.

By incorporating one kind or two or more kinds of the coloring agents different form the near-infrared transmitting black coloring agent (A) (for example, one or more coloring agents selected from the group consisting of a yellow pigment, an orange pigment, a red pigment, a green pigment, a purple pigment, a blue pigment and a black pigment) into the composition for color filter according to the invention, "when a film having a film thickness of 0.5 μm is formed, a standard deviation of a light transmittance in the film thickness direction in a wavelength range from 400 to 630 nm" described hereinafter can be more decreased.

In this case, the coloring agent (B) is in a range from 1 to 300 parts by mass, preferably in a range from 1 to 200 parts by mass, based on 100 parts by mass of the near-infrared transmitting black coloring agent (A).

In the case where the composition for color filter according to the invention contains a pigment as the coloring agent (B), the average particle size of the pigment is preferably 300 nm or less, and more preferably 200 nm or less. The average particle size of the pigment as the coloring agent (B) is usually 10 nm or more.

The near-infrared transmitting black pigment having the average particle size described above (or mixed pigment of the near-infrared transmitting black pigment having the average particle size described above and a pigment as the coloring agent (B)) can be prepared by mixing and dispersing with pulverizing the near-infrared transmitting black pigment (or the mixed pigment described above), preferably as a pigment mixture liquid prepared by mixing the pigment with a dispersant and a solvent, using a pulverizer, for example, a beads mill or a roll mill. The pigment thus-obtained is usually in the form of a pigment dispersion liquid.

—Miniaturization of Pigment—

According to the invention, it is preferred to use a fine and granulated pigment. Miniaturization of the pigment can be achieved through a step which comprises preparing a high-viscosity liquid composition of the pigment together with a water-soluble organic solvent and a water-soluble inorganic salt and then applying stress to the composition using a wet type pulverizing apparatus or the like to grind the pigment.

As the water-soluble organic solvent used in the miniaturization step of the pigment, for example, methanol, ethanol, isopropanol, n-propanol, isobutanol, n-butanol, ethylene glycol, diethylene glycol, diethylene glycol monomethyl ether, diethylene glycol monoethyl ether, diethylene glycol monobutyl ether, propylene glycol and propylene glycol monomethyl ether acetate are exemplified.

Other solvent which has low water-solubility or no water-solubility may be used as long as the solvent is used in such a small amount that it is adsorbed onto the pigment and not discharged into waste water, and examples of the solvent include benzene, toluene, xylene, ethylbenzene, chlorobenzene, nitrobenzene, aniline, pyridine, quinoline, tetrahydrofuran, dioxane, ethyl acetate, isopropyl acetate, butyl acetate, hexane, heptane, octane, nonane, decane, undecane, dodecane, cyclohexane, methylcyclohexane, a halogenated hydrocarbon, acetone, methyl ethyl ketone, methyl isobutyl ketone, cyclohexanone, dimethylformamide, dimethylsulfoxide and N-methylpyrrolidone.

The solvents used in the miniaturization step of the pigment may be employed only one kind or may be used as a mixture of two or more kinds thereof, if desired.

As the water-soluble inorganic salt used in the miniaturization step of the pigment in the invention, for example, sodium chloride, potassium chloride, calcium chloride, barium chloride and sodium sulfate are exemplified.

The amount of the water-soluble inorganic salt used in the miniaturization step is from 1 to 50 times by mass based on the amount of the pigment and a higher grinding effect is achieved when used in a larger amount. From the standpoint of productivity, the amount of the water-soluble inorganic salt is more preferably from 1 to 10 times by mass. The inorganic salt having water content of 1% or less is preferably used.

The amount of the water-soluble organic solvent used in the miniaturization step is in a range from 50 to 300 parts by mass, more preferably in a range from 100 to 200 parts by mass, based on 100 parts by mass of the pigment.

The operation conditions of the wet type pulverizing apparatus in the miniaturization step of the pigment are not particularly restricted. In the case where the apparatus is a kneader, the operation conditions are that the number of revolutions of a blade in the apparatus is preferably from 10 to 200 rpm in order to efficiently progress grinding with pulverizing media, and the revolution ratio between two shafts is preferably relatively higher for a higher grinding effect. The operation time including a dry type pulverizing time is preferably from 1 to 8 hours, and the inner temperature of the apparatus is preferably from 50 to 150° C. The water-soluble inorganic salt which is pulverizing media preferably has a pulverizing particle size from 5 to 50 µm with a sharp particle size distribution and a spherical form.

(Preparation of Pigment Dispersion Liquid)

In the case where the composition for color filter according to the invention contains the near-infrared transmitting black pigment as the near-infrared transmitting black coloring agent (A) (or contains the near-infrared transmitting black pigment as the near-infrared transmitting black coloring agent (A) and a pigment as the coloring agent (B)), the composition for color filter according to the invention is preferably prepared by dispersing the pigment (or these pigments) together with other components, for example, a pigment dispersant, an organic solvent, a pigment derivative or a polymer compound, if desired, to prepare a pigment dispersion liquid, and mixing the pigment dispersion liquid obtained with (C) a photopolymerization initiator, (D) a polymerizable compound and other components added, if desired.

The composition of the pigment dispersion liquid and method of preparing the pigment dispersion liquid are described in detail below.

The method of preparing the pigment dispersion liquid is not particularly limited. As to the method for dispersion, for example, the pigment and a pigment dispersant and the like are premixed, previously dispersed by a homogenizer or the like, and finely dispersed using, for example, a beads dispersing machine (for example, DISPERMAT produced by VMA-Getzmann GmbH) using zirconia beads or the like.

<Pigment Dispersant>

As the pigment dispersant which can be used in the preparation of the pigment dispersion liquid, for example, a polymer dispersant (also referred to as a dispersing resin) (for example, a resin having an amine group (polyamidoamine or a salt thereof), an oligoimine-based resin, a polycarboxylic acid or a salt thereof, a high molecular weight unsaturated acid ester, a modified polyurethane, a modified polyester, a modified poly(meth)acrylate, a (meth)acrylic copolymer or a naphthalene sulfonic acid formalin condensate), a surfactant, for example, a polyoxyethylene alkyl phosphate ester, a polyoxyethylene alkylamine or an alkanolamine, and a pigment derivative are exemplified.

The polymer dispersant can be further classified into a straight-chain polymer, a terminal-modified polymer, a graft polymer and a block polymer according to its structure.

Further, as the polymer dispersant, a resin having an acid value of 60 mgKOH/g or more (more preferably an acid value from 60 to 300 mgKOH/g) is also preferably exemplified.

The polymer dispersant is preferably one or more selected from the group consisting of a resin having an acid value of 60 mgKOH/g or more, a resin containing an amine group and an oligoimine-based resin. This makes it possible to further improve the dispersibility of the near-infrared transmitting black pigment and to incorporate more near-infrared transmitting black pigment into the composition so that the visible component can be more shielded. As a result, an infrared transmission filter which is able to transmit an infrared ray (particularly, a near infrared ray) in the state of low noise derived from the visible light component can be formed.

As the terminal-modified polymer having an anchor moiety to a pigment surface, for example, a polymer having a phosphoric acid group at the terminal described, for example, in JP-A-3-112992 and JP-T-2003-533455, a polymer having a sulfonic acid group at the terminal described, for example, in JP-A-2002-273191, and a polymer having an organic dye partial akeleton or a heterocyclic ring described, for example, in JP-A-9-77994 are exemplified. Also, a polymer in which two or more anchor moieties to a pigment surface (for example, an acid group, a basic group, an organic dye partial skeleton or a heterocyclic ring) are introduced into the polymer terminal described in JP-A-2007-277514 is also preferred because of excellent dispersion stability.

As the graft polymer having an anchor moiety to a pigment surface, a reaction product of a poly(lower alkylene imine) and a polyester described, for example, in JP-A-54-37082, JP-T-8-507960 and JP-A-2009-258668, a reaction product of a polyallylamine and a polyester described, for example, in JP-A-9-169821, a copolymer of a macromonomer and a nitrogen atom-containing monomer described, for example, in JP-A-10-339949 and JP-A-2004-37986, a graft polymer having an organic dye partial skeleton or a heterocyclic ring described, for example, in JP-A-2003-238837, JP-A-2008-9426 and JP-A-2008-81732, and a copolymer of a macromonomer and an acid group-containing monomer described, for example, in JP-A-2010-106268 are exemplified. In particular, an amphoteric dispersing resin having a basic group and an acidic group described in JP-A-2009-203462 is particularly preferred from the standpoint of dispersibility and dispersion stability of the pigment dispersion and development property which the colored radiation-sensitive composition exhibits.

As to the macromonomer used in the case of producing the graft polymer having an anchor moiety to a pigment surface by radical polymerization, a known macromonomer can be used and, for example, MACROMONOMER AA-6 (a polymethyl methacrylate having a terminal group of a methacryloyl group), AS-6 (a polystyrene having a terminal group of a methacryloyl group), AN-6S (a copolymer of styrene and acrylonitrile having a terminal group of a methacryloyl group) and AB-6 (a polybutyl acrylate having a terminal group of a methacryloyl group) produced by Toagosei Co., Ltd., PLACCEL FM5 (a 5 molar equivalent adduct of ε-caprolactone to 2-hydroxyethyl methacrylate) and FA10L (a 10 molar equivalent adduct of ε-caprolactone to 2-hydroxyethyl acrylate) produced by Daicel Chemical Industries Ltd., and a polyester macromonomer described in JP-A-2-272009 are exemplified. Among them, a polyester macromonomer excellent particularly in flexibility and solvent affinity is particularly preferred from the standpoint of dispersibility and dispersion stability of the pigment dispersion and development property which the colored radiation-sensitive composition exhibits, and further, a polyester macromonomer represented by the polyester macromonomer described in JP-A-2-272009 is most preferred.

As the block polymer having an anchor moiety to a pigment surface, a block polymer described, for example, in JP-A-2003-49110 and JP-A-2009-52010 is preferred.

The pigment dispersant is available as a commercial product, and specific examples thereof include DISPER-BYK-101 (polyamidoamine phosphate), 107 (carboxylic acid ester), 110 (copolymer containing an acid group), 130 (polyamide), 161, 162, 163, 164, 165, 166, 170 (high molecular weight copolymer) and BYK-P104, P105 (high molecular weight unsaturated polycarboxylic acid) produced by BYK-Chemie GmbH, EFKA 4047, 4050-4010-4165 (polyurethane), EFKA 4330-4340 (block copolymer), 4400-4402 (modified polyacrylate), 5010 (polyester amide), 5765 (high molecular weight polycarboxylate), 6220 (fatty acid polyester), 6745 (phthalocyanine derivative) and 6750 (azo pigment derivative) produced by EFKA, AJISPER PB821, PB822, PB880 and PB881 produced by Ajinomoto Fine Techno Co., Inc., FLOWLEN TG-710 (urethane oligomer) and POLYFLOW No. 50E and No. 300 (acrylic copolymer) produced by Kyoeisha Chemical Co., Ltd., DISPERON KS-860, 873SN, 874, #2150 (aliphatic polyvalent carboxylic acid), #7004 (polyetherester), DA-703-50, DA-705 and DA-725 produced by Kusumoto Chemicals Ltd., DEMOL RN, N (naphthalenesulfonic acid-formalin polycondensate), MS, C, SN-B (aromatic sulfonic acid-formalin polycondensate), HOMOGENOL L-18 (high molecular weight polycarboxylic acid), EMULGEN 920, 930, 935, 985 (polyoxyethylene nonylphenyl ether) and ACETAMIN 86 (stearylamine acetate) produced by Kao Corp., SOLSPERSE 5000 (phthalocyanine derivative), 22000 (azo pigment derivative), 13240 (polyester amine), 3000, 17000, 27000 (polymer having a functional moiety at terminal), 24000, 28000, 32000, 38500 (graft polymer) produce by Lubrizol Japan Ltd., NIKKOL T106 (polyoxyethylene sorbitan monooleate), MYS-IEX (polyoxyethylene monostearate) produced by Nikko Chemicals Co., Ltd., HINOACT T-8000E produced by Kawaken Fine Chemicals Co., Ltd., Organosiloxane Polymer KP341 produced by Shin-Etsu Chemical Co., Ltd., cationic surfactant W001, nonionic surfactant, for example, polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate or sorbitan fatty acid ester and anionic surfactant, for example, W004, W005 or W017 produced by Yusho Co., Ltd., EFKA-46, EFKA-47, EFKA-47EA, EFKA Polymer 100, EFKA Polymer 400, EFKA Polymer 401 and EFKA Polymer 450 produced by Morishita & Co., Ltd., polymer dispersant, for example, DISPERSE AID 6, DISPERSE AID 8, DISPERSE AID 15 and DISPERSE AID 9100 produced by San Nopco Ltd., ADEKA PLURONIC L31, F38, L42, L44, L61, L64, F68, L72, P95, F77, P84, F87, P94, L101, P103, F108, L121 and P-123 produced by ADEKA Corp., and IONET S-20 produced by Sanyo Chemical Industries, Co, Ltd.

The pigment dispersants may be used individually or in combination of two or more thereof. According to the invention, it is particularly preferred to use a pigment derivative and a polymer dispersant in combination. As to the pigment dispersant, the terminal-modified polymer, graft polymer or block polymer having an anchor moiety to a pigment surface described above may be also used in combination with an alkali-soluble resin described hereinafter as the pigment dispersant. Further, as the pigment dispersant, an alkali-soluble resin or a compound represented by formula (ED) described hereinafter may be used.

The content of the pigment dispersant in the pigment dispersion liquid is preferably from 1 to 80 parts by mass, more preferably from 5 to 70 parts by mass, and still more preferably from 10 to 60 parts by mass, based on 100 parts by mass of the pigment.

Specifically, in the case of using the polymer dispersant, the amount thereof to be used is preferably in a range from 5 to 100 parts, more preferably in a range from 10 to 80 parts in terms of mass, based on 100 parts by mass of the pigment.

The amount of the pigment described above means the total amount of the near-infrared transmitting black pigment and a pigment different therefrom (that is, pigment as the coloring agent (B)).

<Pigment Derivative>

It is preferred that the pigment dispersion liquid further contains a pigment derivative.

The pigment derivative is a compound having a structure wherein a portion of an organic pigment is substituted with an acidic group, a basic group or a phthalimidomethyl group. As to the pigment derivative, it is preferred to include a pigment derivative having an acidic group or a basic group from the standpoint of dispersibility and dispersion stability.

As the organic pigment for constituting the pigment derivative, for example, a diketopyrrolopyrrol-based pigment, an azo-based pigment, a phthalocyanine-based pigment, an anthraquinone-based pigment, a quinacridone-based pigment, a dioxazine-based pigment, a perinone-based pigment, a perylene-based pigment, a thioindigo-based pigment, an isoindoline-based pigment, an isoindolinone-based pigment, a quinophthalone-based pigment, a threne-based pigment and a metal complex-based pigment are exemplified.

As the acid group which the pigment derivative has, a sulfonic acid, a carboxylic acid and a quaternary ammonium salt thereof are preferred, a carboxylic acid group and a sulfonic acid group are more preferred, and a sulfonic acid group is particularly preferred. As the basic group which the pigment derivative has, an amino group is preferred and a tertiary amino group is particularly preferred.

As the pigment derivative, in particular, a quinoline-based pigment derivative, a benzimidazolone-based pigment derivative and an isoindoline-based pigment derivative are preferred, and a quinoline-based pigment derivative and a benzimidazolone-based pigment derivative are more preferred.

The content of the pigment derivative in the pigment dispersion liquid is preferably from 1 to 50% by mass, more preferably from 3 to 30% by mass, based on the total mass of the pigment. The pigment derivative may be used only one kind or in combination of two or more kinds.

Further, in the case of using the pigment derivative together, the amount of the pigment derivative to be used is preferably in a range from 1 to 30 parts, more preferably in a range from 3 to 20 parts, particularly preferably in a range from 5 to 15 parts, in terms of mass, based on 100 parts by mass of the pigment.

The amount of the pigment described above means the total amount of the near-infrared transmitting black pigment and a pigment different therefrom (that is, pigment as the coloring agent (B)).

<Organic Solvent>

It is preferred that the pigment dispersion liquid contains an organic solvent.

The organic solvent is selected according to solubility of each component contained in the pigment dispersion liquid, a coating property in the case of applying the pigment dispersion liquid to a colored radiation-sensitive composition and the like. As the organic solvent, an ester, an ether, a ketone and an aromatic hydrocarbon are used. Among them, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, diethylene glycol monoethyl ether acetate, diethylene glycol mono-butyl ether acetate, propylene glycol methyl ether and propylene glycol monomethyl ether acetate are preferred. It is also preferred to use (F) an organic solvent which can be incorporated into the colored radiation-sensitive composition described hereinafter.

The content of the organic solvent in the pigment dispersion liquid is preferably from 50 to 95% by mass, and more preferably from 70 to 90% by mass.

<Polymer Compound>

A polymer compound may further be incorporated into the pigment dispersion liquid in addition to the respective components described above from the standpoint of improvement in the dispersion stability, control of the development property in the case of applying the pigment dispersion liquid to a colored radiation-sensitive composition and the like.

As the polymer compound, for example, a polyamidoamine or a salt thereof; a polycarboxylic acid or a salt thereof, a high molecular weight unsaturated acid ester, a modified polyurethane, a modified polyester, a modified poly(meth)acrylate, a (meth)acrylic copolymer (particularly preferably, a (meth)acrylic acid copolymer containing a carboxylic acid group and a polymerizable group in its side chain) and a naphthalene sulfonic acid-formalin condensate are exemplified. The polymer material adsorbs on a surface of the pigment to act so as to prevent reaggregation and thus, a terminal-modified polymer, a graft polymer and a block polymer each having an anchor moiety to a pigment surface are preferred, for example, a graft copolymer containing a monomer containing a heterocyclic ring and a polymerizable oligomer having an ethylenically unsaturated bond as the copolymer units is exemplified.

As other polymer materials, for example, a polyamidoamine phosphate, a high molecular weight unsaturated polycarboxylic acid, a polyetherester, an aromatic sulfonic acid-formalin polycondensate, polyoxyethylene nonylphenyl ether, a polyesteramine, polyoxyethylene sorbitan monooleate, polyoxyethylene monostearate are further exemplified.

The polymer materials may be used individually or in combination two or more thereof.

The content of the polymer material in the pigment dispersion liquid is preferably from 20 to 80% by mass, more preferably from 30 to 70% by mass, still more preferably from 40 to 60% by mass, based on the pigment.

[Preparation of Colored Radiation-Sensitive Composition]

The composition (typically, composition for color filter containing the near-infrared transmitting black coloring agent (A) (for example, the pigment dispersion liquid) and, if desired, the coloring agent (B)) is a composition for color filter containing (C) a photopolymerization initiator, (D) a polymerizable compound and, if desired each component, for example, (E) an ultraviolet absorbing agent, (F) an alkali-soluble resin, (G) an organic solvent or a surfactant.

The composition for color filter containing the near-infrared transmitting black coloring agent (A), the photopolymerization initiator (C) and the polymerizable compound (D) is also referred to as a colored radiation-sensitive composition (more preferably, a black radiation-sensitive composition).

The colored radiation-sensitive composition is used for the formation of infrared transmission filter according to the invention and, for example, a colored cured film obtained by polymerization curing of the colored radiation-sensitive composition is used as the infrared transmission filter.

Each component which may be further incorporated into the composition (particularly, colored radiation-sensitive composition) according to the invention is described in detail below.

In the composition according to the invention, the total solid content means the total mass of the components excluding an organic solvent from the total composition of the composition.

In the specification, an "alkyl group" represents a "straight-chain, branched and cyclic" alkyl group, and may be substituted with a substituent or unsubstituted.

Also, in the specification, "(meth)acrylate" represents both of acrylate and methacrylate or either one of them, "(meth)acryl" represents both of acryl and methacryl or either one of them, and "(meth)acryloyl" represents both of acryloyl and methacryloyl or either one of them.

Also, in the specification, "monomer" and "monomer" have the same meaning. The monomer in the specification is distinguished from an oligomer and a polymer and means a compound having a weight average molecular weight of 2,000 or less. In the specification, a polymerizable compound means a compound having a polymerizable functional group and may be a monomer or a polymer. The polymerizable functional group means a group involved in a polymerization reaction.

Also, in the specification, with respect to the description of a group (atomic group), when the group is not indicated whether substituted or unsubstituted, the group includes the group which has a substituent as well as the group which does not have a substituent. For example, "an alkyl group" includes not only an alkyl group which does not have a substituent (an unsubstituted alkyl group) but also an alkyl group which has a substituent (a substituted alkyl group).

In the specification, the term "step" includes not only an independent step but also a case where the desired effect of a step is achieved even if it cannot be clearly distinguished from other steps.

In the invention, "radiation" has a meaning of including visible light, an ultraviolet ray, a far ultraviolet ray, an electron beam, an X-ray and the like.

<(C) Photopolymerization Initiator>

The composition for color filter (typically, the colored radiation-sensitive composition) according to the invention preferably contains (C) a photopolymerization initiator.

As the photopolymerization initiator (hereinafter, also referred to as a "polymerization initiator") according to the invention, compounds known as polymerization initiators described below can be employed.

The photopolymerization initiator is not particularly restricted as long as it has an ability of initiating polymerization of the polymerizable compound described above and may be appropriately selected from known photopolymerization initiators. For example, those having sensitivity to light in the region from ultraviolet to visible are preferred. The photopolymerization initiator may also be an activator capable of causing a certain action with a photoexcited sensitizer to generate an active radical or an initiator capable of initiating cationic polymerization depending on the kind of the monomer.

Further, the photopolymerization initiator preferably contains at least one kind of a compound having a molecular extinction coefficient of at least about 50 in the range from about 300 to about 800 nm (more preferably from 330 to 500 nm).

As the photopolymerization initiator, for example, a halogenated hydrocarbon derivative (for example, a compound having a triazine skeleton or a compound having an oxadiazole skeleton), an acylphosphine compound, for example, an acylphosphine oxide, a hexaarylbiimidazole, an oxime compound, for example, an oxime derivative, an organic peroxide, a thio compound, a ketone compound, an aromatic onium salt, a ketoxime ether, an aminoacetophenone compound and a hydroxyacetophenone are exemplified. Of the compounds, an oxime compound is preferred.

As the halogenated hydrocarbon compound having a triazine skeleton described above, for example, compounds described in Wakabayashi et al., *Bull. Chem. Soc. Japan,* 42, 2924 (1969), compounds described in Britain Patent 1,388, 492, compounds described in JP-A-53-133428, compounds described in Germany Patent 3337024, compounds described in F. C. Schaefer et al., *J. Org. Chem.,* 29, 1527 (1964), compounds described in JP-A-62-58241, compounds described in JP-A-5-281728, compounds described in JP-A-5-34920 and compounds described in U.S. Pat. No. 4,212,976 are exemplified.

As the compounds described in U.S. Pat. No. 4,212,976 described above, for example, a compound having an oxadiazole skeleton (for example, 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole, 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-buthoxystyryl)-1,3,4-oxadiazole or 2-trichloromethyl-5-styryl-1,3,4-oxadiazole) is exemplified.

As the polymerization initiator other than those described above, for example, an acridine derivative (for example, 9-phenylacridine or 1,7-bis(9,9'-acridinyl)heptane), N-phenylglycine, a polyhalogen compound (for example, carbon tetrabromide, phenyl tribromomethyl sulfone or phenyl trichloromethyl ketone), a coumarin (for example, 3-(2-benzofuryl)-7-diethylaminocoumarin, 3-(2-benzofuroyl)-7-(1-pyrrolidinyl)coumarin, 3-benzoyl-7-diethylaminocoumarin, 3-(2-methoxybenzyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-dipropoxycoumarin, 7-benzotriazol-2-ylcoumarin or coumarin compounds described, for example, in JP-A-5-19475, JP-A-7-271028, JP-A-2002-363206, JP-A-2002-363207, JP-A-2002-363208 and JP-A-2002-363209), an acylphosphine oxide (for example, bis(2,4,6-trimethylbenzoyl)phenylphosphine oxide, bis(2,6-dimethoxybenzoyl)-2,4,4-trimethylpentylphenylphosphine oxide or LUCIRIN TPO), a metallocene (for example, bis(η5-2,4-cyclopentadien-1-yl)-bis(2,6-difluoro-3-(1H-pyrrol-1-yl) phenyl)titanium or η5-cyclopentadienyl-η6-cumenyl-iron(1+)-hexafluorophosphate (1−)), and compounds described, for example, in JP-A-53-133428, JP-B-57-1819, JP-B-57-6096 and U.S. Pat. No. 3,615,455 are exemplified.

As the ketone compound described above, for example, benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenone tetracarboxylic acid or a tetra methyl ester thereof, a 4,4'-bis(dialkylamino)benzophenone (for example, 4,4'-bis(dimethylamino)benzophenone, 4,4'-bis(dicyclohexylamino)benzophenone, 4,4'-bis(diethylamino)benzophenone, 4,4'-bis(dihydroxyethylamino)benzophenone, 4-methoxy-4'-dimethylaminobenzophenone, 4,4'-dimethoxybenzophenone, 4-dimethylaminobenzophenone or 4-dimethylaminoacetophenone), benzyl, anthraquinone, 2-tert-butylanthraquinone, 2-methylanthraquinone, phenanthraquinone, xanthone, thioxanthone, 2-chlorothioxanthone, 2,4-diethylthioxanthone, fluorenone, 2-benzyl-dimethylamino-1-(4-morpholinophenyl)-1-butanone, 2-methyl-1-[4-(methylthio)phenyl]-2-morpholino-1-propanone, 2-hydroxy-2-methyl-[4-(1-methylvinyl)phenyl]propanol oligomer, benzoin, a benzoin ether (for example, benzoin methyl ether, benzoin ethyl ether, benzoin propyl ether, benzoin isopropyl ether, benzoin phenyl ether or benzyl dimethyl ketal), acridone, chloroacridone, N-methylacridone, N-butylacridone and N-butyl-chloroacridone are exemplified.

As the polymerization initiator, a hydroxyacetophenone compound, an aminoacetophenone compound and an acylphosphine compound can also be preferably used. More specifically, for example, an aminoacetophenone-based initiator described in JP-A-10-291969 and an acylphosphine oxide-based initiator described in Japanese Patent No. 4,225,898 can also be used.

As the hydroxyacetophenone-based initiator, IRGACURE 184, DAROCUR 1173, IRGACURE 500, IRGACURE 2959 and IRGACURE 127 (trade names, all produced by BASF Corp.) can be used. As the aminoacetophenone-based initiator, commercially available IRGACURE 907, IRGACURE 369 and IRGACURE 379 (trade names, all produced by BASF Corp.) can be used. As the aminoacetophenone-based initiator, compounds in which the absorption wavelength matches a light source having a long wavelength, for example, 365 nm or 405 nm described in JP-A-2009-191179 can also be used. As the acylphosphine-based initiator, commercially available IRGACURE 819 and DAROCUR TPO (trade names, all produced by BASF Corp.) can be used.

As the polymerization initiator, an oxime compound is more preferably exemplified.

By incorporating the oxime compound, as the polymerization initiator, into the composition, characteristic dependency of pattern (hereinafter, simply referred to as "PCD dependency") on time from coating of the composition to exposure (PCD: Post Coating Delay) is improved.

As specific examples of the oxime compound, compounds described in JP-A-2001-233842, compounds describe in JP-A-2000-80068 and compounds described in JP-A-2006-342166 can be used.

As the oxime compound, for example, an oxime derivative, which is preferably used as the polymerization initiator in the invention, for example, 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one and 2-ethoxycarbonyloxyimino-1-phenylpropan-1-one are exemplified.

As the oxime compound, for example, compounds described in *J. C. S. Perkin I*, pp. 1653-1660 (1979), *J. C. S. Perkin II*, pp. 156-162 (1979), *Journal of Photopolymer Science and Technology*, pp. 202-232 (1995) and JP-A-2000-66385, and compounds described in JP-A-2000-80068, JP-T-2004-534797 and JP-A-2006-342166 are exemplified.

As a commercial product, IRGACURE OXE01 (produced by BASF Corp.), IRGACURE OXE02 (produced by BASF Corp.) and TR-PBG-304 (produced by Changzhou Tronly New Electronic Materials Co., Ltd.) can also be preferably used.

As the oxime compound other than those described above, for example, compounds wherein oxime is connected to N-position of carbazole described in JP-T-2009-519904, compounds wherein a hetero substituent is introduced into a benzophenone moiety described in U.S. Pat. No. 7,626,957, compounds wherein a nitro group is introduced into a dye moiety described in JP-A-2010-15025 and U.S. Patent Publication No. 2009/0292039, ketoxime-based compounds described in WO 2009/131189, compounds containing a triazine skeleton and an oxime skeleton in the same molecule described in U.S. Pat. No. 7,556,910 and compounds having an absorption maximum at 405 nm and exhibiting good sensitivity to a g-line light source described in JP-A-2009-221114 may also be used.

Further, cyclic oxime compounds described in JP-A-2007-231000 and JP-A-2007-322744 can also be preferably used. Of the cyclic oxime compounds, cyclic oxime compounds fused to carbazole dyes described in JP-A-2010-32985 and JP-A-2010-185072 are preferred from the standpoint of high light absorbing property and high sensitivity.

Also, compounds having an unsaturated bond at a specific site of an oxime compound described in JP-A-2009-242469 can be preferably used because they can achieve high sensitivity by regenerating an active radical from a polymerization inactive radical.

Most preferably, oxime compounds having a specific substituent described in JP-A-2007-269779 and oxime compounds having a thioaryl group described in JP-A-2009-191061 are exemplified.

Specifically, as the oxime compound, a compound represented by formula (OX-1) shown below is preferred. The oxime compound may be a compound where the N—O bond of oxime is (E) form, a compound where the bond is (Z) form or a compound which is a mixture of (E) form and (Z) form.

[Chem. 2]

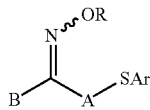

(OX-1)

In formula (OX-1),

R and B each independently represents a monovalent substituent, A represents a divalent organic group, and Ar represents an aryl group.

In formula (OX-1), the monovalent substituent represented by R is preferably a monovalent nonmetallic atomic group.

As the monovalent nonmetallic atomic group described above, for example, an alkyl group, an aryl group, an acyl group, an alkoxycarbonyl group, an aryloxycarbonyl group, a heterocyclic group, an alkylthiocarbonyl group and an arylthiocarbonyl group are exemplified. These groups may have one or more substituents. The substituent described above may be further substituted with other substituent.

As the substituent, for example, a halogen atom, an aryloxy group, an alkoxycarbonyl group, an aryloxycarbonyl group, an acyloxy group, an acyl group, an alkyl group and an aryl group are exemplified.

As the alkyl group which may have a substituent, an alkyl group having from 1 to 30 carbon atoms is preferred. Specifically, the description in Paragraph No. [0026] of JP-A-2012-32556 and the like can be referred to, and the contents thereof are incorporated herein by reference.

As the aryl group which may have a substituent, an aryl group having from 6 to 30 carbon atoms is preferred. An aryl group having from 6 to 30 carbon atoms is preferred. Specifically, the description in Paragraph No. [0027] of JP-A-2012-32556 and the like can be referred to, and the contents thereof are incorporated herein by reference.

As the acyl group which may have a substituent, an acyl group having from 2 to 20 carbon atoms is preferred. Specifically, the description in Paragraph No. [0028] of JP-A-2012-32556 and the like can be referred to, and the contents thereof are incorporated herein by reference.

As the alkoxycarbonyl group which may have a substituent, an alkoxycarbonyl group having from 2 to 20 carbon atoms is preferred. Specifically, the description in Paragraph No. [0030] of JP-A-2012-32556 and the like can be referred to, and the contents thereof are incorporated herein by reference.

As the aryloxycarbonyl group which may have a substituent, specifically, the description in Paragraph No. [0030] of JP-A-2012-32556 and the like can be referred to, and the contents thereof are incorporated herein by reference.

The heterocyclic group which may have a substituent is preferably an aromatic or aliphatic heterocyclic group containing a nitrogen atom, an oxygen atom, a sulfur atom or a phosphorus atom.

Specifically, the description in Paragraph No. [0031] of JP-A-2012-32556 and the like can be referred to, and the contents thereof are incorporated herein by reference.

As the alkylthiocarbonyl group which may have a substituent, specifically, the description in Paragraph No. [0032] of JP-A-2012-32556 and the like can be referred to, and the contents thereof are incorporated herein by reference.

As the arylthiocarbonyl group which may have a substituent, specifically, the description in Paragraph No. [0033] of JP-A-2012-32556 and the like can be referred to, and the contents thereof are incorporated herein by reference.

In formula (OX-1), the monovalent substituent represented by B represents an aryl group, a heterocyclic group, an arylcarbonyl group or a heterocyclic carbonyl group. These groups may have one or more substituents. As the substituent, the substituents described above are exemplified. Also, the substituent described above may be further substituted with other substituent.

Among them, structures shown below are particularly preferred.

In the structures below, Y, X and n have the same meanings as Y, X and n in Formula (OX-2) described below, and preferred examples thereof are also the same.

[Chem. 3]

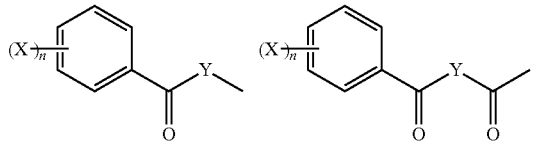

In formula (OX-1), as the divalent organic group represented by A, an alkylene group having from 1 to 12 carbon atoms, a cyclohexylene group and an alkynylene group are exemplified. These groups may have one or more substituents. As the substituent, the substituents described above are exemplified. Also, the substituent described above may be further substituted with other substituent.

Among them, from the standpoint of increasing sensitivity and inhibiting coloration due to heating aging, A in formula (OX-1) is preferably an unsubstituted alkylene group, an alkylene group substituted with an alkyl group (for example, a methyl group, an ethyl group, a tert-butyl group or a dodecyl group), an alkylene group substituted with an alkenyl group (for example, a vinyl group or an allyl group) or an alkylene group substituted with an aryl group (for example, a phenyl group, a p-tolyl group, a xylyl group, a cumenyl group, a naphthyl group, an anthryl group, a phenanthryl group or a styryl group).

In formula (OX-1), the aryl group represented by Ar is preferably an aryl group having from 6 to 30 carbon atoms and may have a substituent. As the substituent, the same as those of the substituent introduced into the substituted aryl group described above as the specific example of the aryl group which may have a substituent is exemplified.

Among them, from the standpoint of increasing sensitivity and inhibiting coloration due to heating aging, a substituted or unsubstituted phenyl group is preferred.

In formula (OX-1), the structure "SAr" formed by Ar and S adjacent thereto is preferably the structure described in Paragraph No. [0040] of JP-A-2012-32556 and the like, and the contents thereof are incorporated herein by reference.

The oxime compound is preferably a compound represented by formula (OX-2) shown below.

[Chem. 4]

$$\text{(OX-2)}$$

(X)$_n$— ...—Y—...—A—SAr, N—OR

In formula (OX-2), R and X each independently represents a monovalent substituent, A and Y each independently represent a divalent organic group, Ar represents an aryl group, and n represents an integer from 0 to 5.

In formula (OX-2), R, A and Ar have the same meanings as R, A and Ar in formula (OX-1), and preferred examples thereof are also the same.

In formula (OX-2), as the monovalent substituent represented by X, an alkyl group, an aryl group, an alkoxy group, an aryloxy group, an acyloxy group, an acyl group, an alkoxycarbonyl group, an amino group, a heterocyclic group and a halogen atom are exemplified. These groups may have one or more substituents. As the substituent, the substituents described above are exemplified. Also, the substituent described above may be further substituted with other substituent.

Among them, X in formula (OX-2) is preferably an alkyl group from the standpoint of solvent solubility and increase in absorption efficiency in the long wavelength region.

Also, n in formula (OX-2) represents an integer from 0 to 5, and is preferably an integer from 0 to 2.

In formula (OX-2), as the divalent organic group represented by Y, structures shown below are exemplified. In the groups shown below, * indicates a connecting position to the carbon atom adjacent to Y in formula (OX-2).

[Chem. 5]

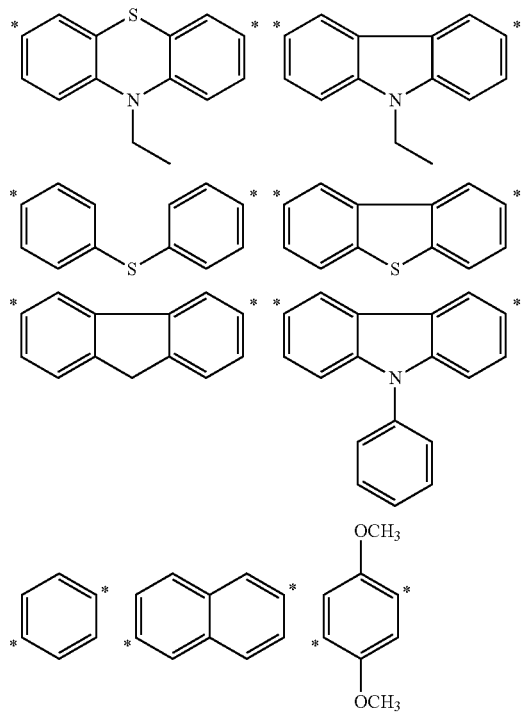

Among them, as the photopolymerization initiator, those having the structures shown below are preferred from the standpoint of high sensitivity.

[Chem. 6]

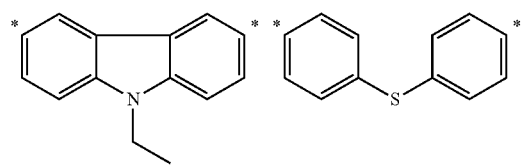

Further, the oxime compound is preferably a compound represented by formula (OX-3) shown below.

[Chem. 7]

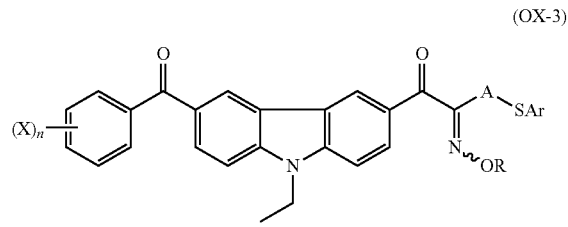

(OX-3)

In formula (OX-3), R and X each independently represents a monovalent substituent, A represents a divalent organic group, Ar represents an aryl group, and n is an integer from 0 to 5.

In formula (OX-3), R, X, A, Ar and n have the same meanings as R, X, A, Ar and n in formula (OX-2), and preferred examples thereof are also the same.

Specific examples of the oxime compound preferably used are set forth below, but the invention should not be construed as being limited thereto.

[Chem. 8]

(C-4)
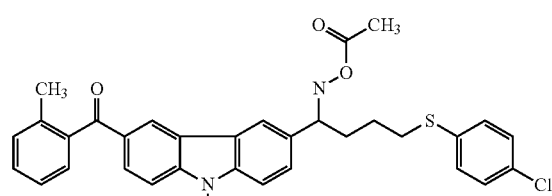

(C-5)
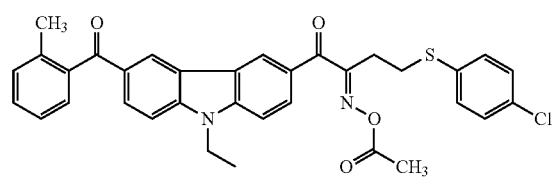

(C-6)
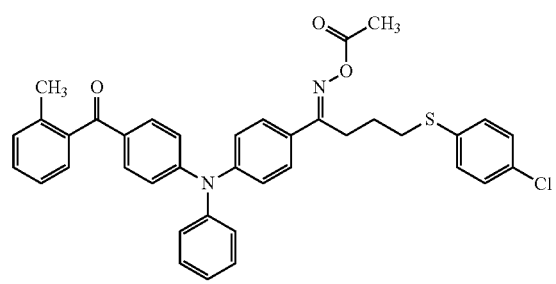

(C-7)
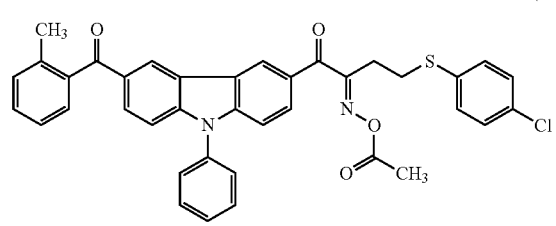

(C-8)
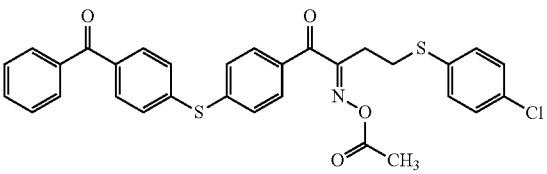

-continued (C-9)
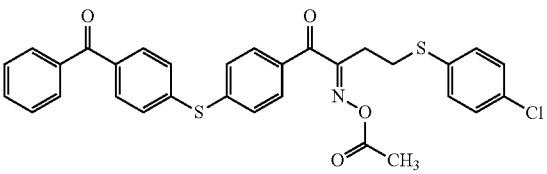

(C-10)
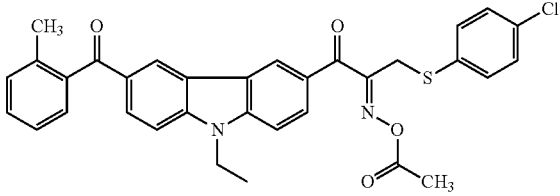

(C-11)
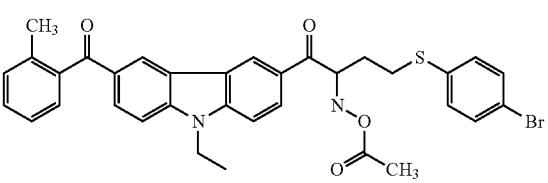

(C-12)
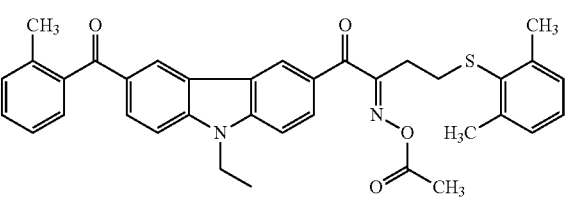

(C-13)
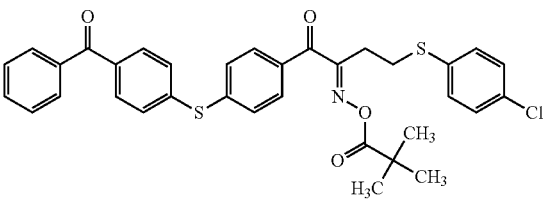

[Chem. 9]

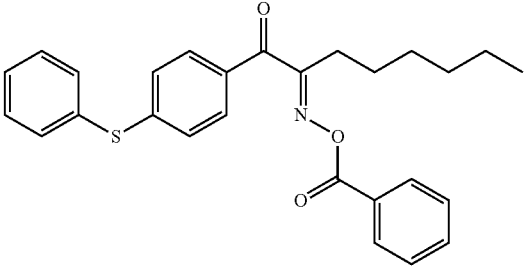

The oxime compound is a compound having a maximum absorption wavelength in the wavelength region from 350 to 500 nm, preferably a compound having an absorption wavelength in the wavelength region from 360 to 480 nm, and particularly preferably a compound having high absorbance at wavelengths of 365 nm and 455 nm.

The molar extinction coefficient at a wavelength of 365 nm or 405 nm of the oxime compound is preferably from 1,000 to 300,000, more preferably from 2,000 to 300,000, particularly preferably from 5,000 to 200,000, from the standpoint of sensitivity.

The molar extinction coefficient of the compound can be determined using a known method and specifically, for example, it is preferred to measure at a concentration of 0.01 g/L using an ethyl acetate solvent by an ultraviolet-visible spectrophotometer (Carry-5 Spectrophotometer produced by Varian, Inc.).

The photopolymerization initiators for use in the invention may be employed in combination of two or more thereof, if desired.

The content (total content in the case of using two or more kinds) of the photopolymerization initiator in the composition for color filter is preferably in a range from 0.1 to 20% by mass, more preferably in a range from 0.5 to 10% by mass, particularly preferably in a range from 1 to 8% by mass, based on the total solid content of the composition. In the range described above, good sensitivity and good pattern-forming property are achieved.

The composition for color filter may contain a sensitizer for the purpose of increasing the radical generation efficiency of the photopolymerization initiator and shifting a photosensitive wavelength to a long wavelength side. As the sensitizer which can be used in the invention, that sensitizes the photopolymerization initiator (C) described above with an electron transfer mechanism or an energy transfer mechanism is preferred.

As the sensitizer for use in the composition for color filter, for example, compounds described in Paragraph Nos. [0101]-[0154] of JP-A-2008-32803 are exemplified.

The content of the sensitizer in the composition is preferably from 0.1 to 20% by mass, more preferably from 0.5 to 15% by mass, in terms of the solid content, from the standpoint of light absorption efficiency in the deep portion and initiation decomposition efficiency.

The sensitizers may be used individually or in combination of two or more thereof.

<(D) Polymerizable Compound>

The composition for color filter (typically, the colored radiation-sensitive composition) according to the invention preferably contains (D) a polymerizable compound.

The polymerizable compound is selected from compounds having at least one terminal ethylenically unsaturated bond, preferably two or more terminal ethylenically unsaturated bonds. Among them, a multifunctional polymerizable compound of tetrafunctional or more is preferred, and a multifunctional polymerizable compound of pentafunctional or more is more preferred.

Such a group of compounds are widely known in the field of art and these compounds can be used in the invention without any particular limitation. The compound may be in any of chemical forms, for example, a monomer, a prepolymer, specifically, a dimer, a trimer or an oligomer, and a mixture thereof or a multimer thereof. The polymerizable compounds according to the invention may be used individually or in combination of two or more thereof.

More specifically, examples of the monomer and prepolymer thereof include an unsaturated carboxylic acid (for example, acrylic acid, methacrylic acid, itaconic acid, crotonic acid, isocrotonic acid or maleic acid), its esters and amides, and multimers thereof. Esters of an unsaturated carboxylic acid and an aliphatic polyhydric alcohol compound, amides of an unsaturated carboxylic acid and an aliphatic polyvalent amine compound, and multimers thereof are preferred. Also, an addition reaction product of an unsaturated carboxylic acid ester or amide having a nucleophilic substituent, for example, a hydroxy group, an amino group or a mercapto group, with a monofunctional or polyfunctional isocyanate or epoxy compound, and a dehydration condensation reaction product with a monofunctional or polyfunctional carboxylic acid may also be preferably used. Further, an addition reaction product of an unsaturated carboxylic acid ester or amide having an electrophilic substituent, for example, an isocyanate group or an epoxy group, with a monofunctional or polyfunctional alcohol, amine or thiol, and a substitution reaction product of an unsaturated carboxylic acid ester or amide having a releasable substituent, for example, a halogen group or a tosyloxy group, with a monofunctional or polyfunctional alcohol, amine or thiol are also preferable. As other examples, compounds where the unsaturated carboxylic acid described above is replaced by an unsaturated phosphonic acid, a vinylbenzene derivative, for example, styrene, a vinyl ether, an allyl ether may also be used.

As to specific examples of the compound, compounds described in Paragraph Nos. [0095] to [0108] of JP-A-2009-288705 can also be preferably used in the invention.

As the polymerizable compound, a compound having at least one addition-polymerizable ethylene group and having a boiling point of 100° C. or more under a normal pressure is also preferred. Examples thereof include a monofunctional acrylate or metacrylate, for example, polyethylene glycol mono(meth)acrylate, polypropylene glycol mono(meth)acrylate or phenoxyethyl (meth)acrylate; a polyfunctional acrylate or methacrylate, for example, polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate, a compound obtained by adding ethylene oxide or propylene oxide to a polyfunctional alcohol, for example, glycerol or trimethylolethane, followed by (meth)acrylation, an urethane (meth)acrylate as described in JP-B-48-41708, JP-B-50-6034 and JP-A-51-37193, a polyester acrylate described in JP-A-48-64183, JP-B-49-43191 and JP-B-52-30490, and an epoxy acrylate as a reaction product of an epoxy resin and (meth)acrylic acid; and a mixture thereof.

A polyfunctional (meth)acrylate obtained by reacting a polyfunctional carboxylic acid with a compound having a cyclic ether group and an ethylenically unsaturated group, for example, glycidyl (meth)acrylate is also exemplified.

As other preferred polymerizable compounds, compounds having a fluorene ring and difunctional or more ethylenically unsaturated groups described in JP-A-2010-160418, JP-A-2010-129825 and Japanese Patent No. 4,364,216, and a cardo resin can also be used.

As the compound having a boiling point of 100° C. or more under a normal pressure and having at least one addition-polymerizable ethylenically unsaturated group, compounds described in Paragraph Nos. [0254] to [0257] of JP-A-2008-292970 are also preferable.

In addition, radical polymerizable monomers represented by formulae (MO-1) to (MO-5) shown below can also preferably used. In the formula, when T is an oxyalkylene group, the terminal on the carbon atom side thereof is connected to R.

[Chem. 10]

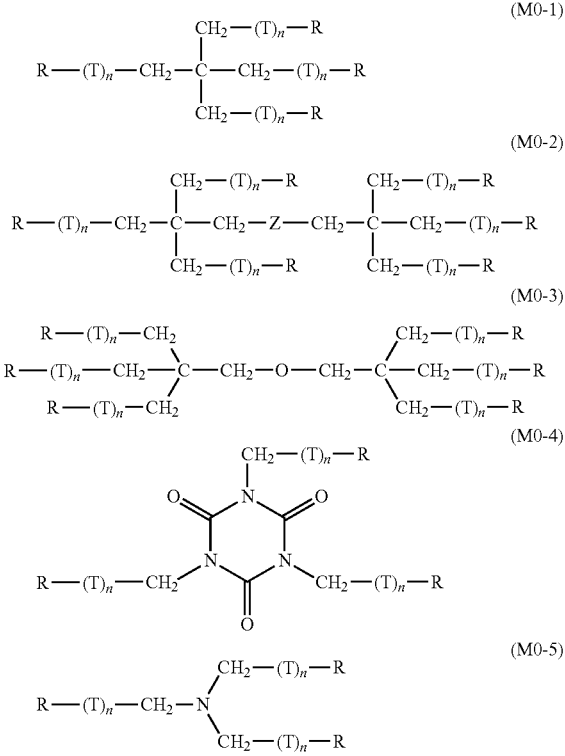

[Chem. 11]

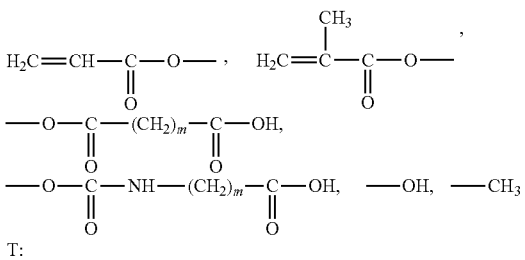

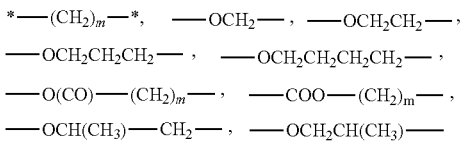

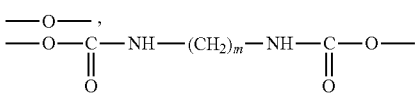

In the formulae above, n is from 0 to 14 and m is from 1 to 8. When plural Rs or plural Ts are present in one molecule, plural Rs or plural Ts may be the same or different from each other.

In each of the polymerizable compounds represented by formulae (MO-1) to (MO-5), at least one of plural Rs represents a group represented by —OC(=O)CH—CH$_2$ or —OC(=O)C(CH$_3$)=CH$_2$.

As to specific examples of the polymerizable compounds represented by formulae (MO-1) to (MO-5), compounds described in Paragraph Nos. [0248] to [0251] of JP-A-2007-269779 can also be preferably used in the invention.

Compounds obtained by adding ethylene oxide or propylene oxide to the above-described polyfunctional alcohol and then (meth)acrylating the adduct, described as formulae (1) and (2) together with their specific examples in JP-A-10-62986, can also be used as the polymerizable compound.

Among them, as the compounds, dipentaerythritol triacrylate (as a commercial product, KAYARAD D-330 produced by Nippon Kayaku Co., Ltd.), dipentaerythritol tetraacrylate (as a commercial product, KAYARAD D-320 produced by Nippon Kayaku Co., Ltd.), dipentaerythritol penta(meth)acrylate (as a commercial product, KAYARAD D-310 produced by Nippon Kayaku Co., Ltd.), dipentaerythritol hexa(meth)acrylate (as a commercial product, KAYARAD DPHA produced by Nippon Kayaku Co., Ltd.), and structures where the (meth)acryloyl groups of the compounds described above are connected through an ethylene glycol or propylene glycol residue are exemplified.

Also, as the polymerizable compound, for example, 2-(meth)acryloyloxy ethyl caproate acid phosphate (as a commercial product, PM-20 produced by Nippon Kayaku Co., Ltd.) and an urethane acrylate (as a commercial product, U-6LPA produced by Shin-Nakamura Chemical Co., Ltd.) are preferably exemplified.

Oligomer types of these compounds can also be used. Preferred embodiments of the polymerizable compound are described below.

The polymerizable compound may be a polyfunctional monomer having an acid group, for example, a carboxyl group, a sulfonic acid group or a phosphoric acid group. An ethylenic compound having an unreacted carboxyl group as in the case of the mixture described above may be used as it is, but, if desired, a non-aromatic carboxylic anhydride may be reacted with a hydroxy group of the ethylenic compound to introduce an acid group. In this case, specific examples of the non-aromatic carboxylic anhydride include tetrahydrophthalic anhydride, an alkylated tetrahydrophthalic anhydride, hexahydrophthalic anhydride, an alkylated hexahydrophthalic anhydride, succinic anhydride and maleic anhydride.

In the invention, the monomer having an acid group is preferably a polyfunctional monomer which is an ester of an aliphatic polyhydroxy compound and an unsaturated carboxylic acid and obtained by reacting a non-aromatic carboxylic anhydride with an unreacted hydroxy group of the aliphatic polyhydroxy compound to introduce the acid group, and particularly preferably the ester described above where the aliphatic polyhydroxy compound is pentaerythritol and/or dipentaerythritol. As the commercial product thereof, for example, as a polybasic acid-modified acrylic oligomer, M-510 and M-520 produced by Toagosei Co., Ltd. are exemplified.

In the composition for color filter according to the invention, one of the polymerizable compounds may be used alone, but since it is difficult to use a single compound in view of production, two or more of the polymerizable compounds may be used as a mixture.

Also, as the polymerizable compound, a polyfunctional monomer having no acid group and a polyfunctional monomer having an acid group may be used in combination, if desired.

The acid value of the polyfunctional monomer having an acid group is preferably from 0.1 to 40 mgKOH/g, and particularly preferably from 5 to 30 mgKOH/g. When the acid value of the polyfunctional monomer having an acid group is too small, the development dissolution property is deteriorated, and when it is too large, the production and handling become difficult and the photopolymerization property is deteriorated, thereby degrading the curing property, for example, surface smoothness of pixel. Therefore, in the case where two or more polyfunctional monomers having different acid groups are used in combination or where a polyfunctional monomer having no acid group is used in combination, it is preferred to adjust the polyfunctional monomers such that the acid value as the total polyfunctional monomer falls within the range described above.

Also, it is a preferred embodiment as the polymerizable compound to contain a polyfunctional monomer having a caprolactone structure.

The polymerizable compound having a caprolactone structure is not particularly limited as long as it has a caprolactone structure in the molecule thereof, and includes, for example, an ε-caprolactone-modified polyfunctional (meth)acrylate obtained by esterification of a polyhydric alcohol, for example, trimethylolethane, ditrimethylolethane, trimethylolpropane, ditrimethylolpropane, pentaerythritol, dipentaerythritol, tripentaerythritol, glycerol, diglycerol or trimethylolamine with (meth)acrylic acid and ε-caprolactone. Among them, a polyfunctional monomer having a caprolactone structure represented by formula (Z-1) shown below is preferred.

[Chem. 12]

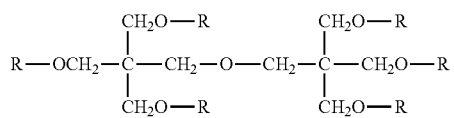
(Z-1)

In formula (Z-1), all of six Rs are groups represented by formula (Z-2) shown below, or one to five of six Rs are groups represented by formula (Z-2) shown below and the remainder is a group represented by formula (Z-3) shown below.

[Chem. 13]

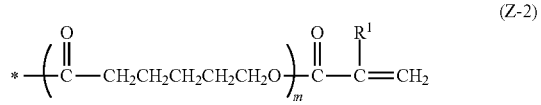
(Z-2)

In formula (Z-2), $R^1$ represents a hydrogen atom or a methyl group, m represents a number of 1 or 2, and * represents a connecting portion.

[Chem. 14]

(Z-3)

In formula (Z-3), $R^1$ represents a hydrogen atom or a methyl group and * represents a connecting portion.

The polyfunctional monomer having a caprolactone structure is commercially available as KAYARAD DPCA Series from Nippon Kayaku Co., Ltd. and includes, for example, DPCA-20 (compound represented by formulae (Z-1) to (Z-3), wherein m is 1, a number of the group represented by formula (Z-2) is 2, and all of $R^1$ are hydrogen atoms), DPCA-30 (compound represented by formulae (Z-1) to (Z-3), wherein m is 1, a number of the group represented by formula (Z-2) is 3, and all of $R^1$ are hydrogen atoms), DPCA-60 (compound represented by formulae (Z-1) to (Z-3), wherein m is 1, a number of the group represented by formula (Z-2) is 6, and all of $R^1$ are hydrogen atoms) and DPCA-120 (compound represented by formulae (Z-1) to (Z-3), wherein m is 2, a number of the group represented by formula (Z-2) is 6, and all of $R^1$ are hydrogen atoms).

The polyfunctional monomers having a caprolactone structure may be used individually or as a mixture of two or more thereof in the invention.

The polymerizable compound according to the invention is preferably a polymerizable compound containing an alkylene oxy group having two or more carbon atoms (for example, an ethylene oxy group, a propylene oxy group or a butylene oxy group).

Of the polymerizable compound containing an alkylene oxy group having two or more carbon atoms, at least one selected from the group of compounds represented by formulae (i) and (ii) shown below is particularly preferred.

[Chem. 15]

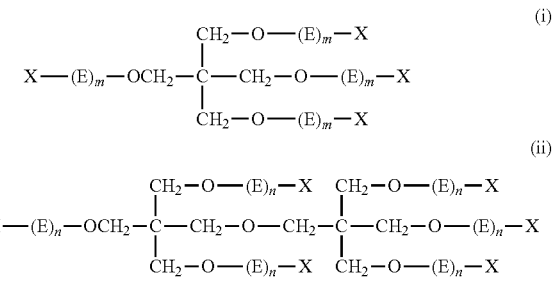

In formulae (i) and (ii), E each independently represents —(($CH_2$)$_y$$CH_2$O)— or —(($CH_2$)$_y$CH($CH_3$)O)—, y each independently represents an integer from 0 to 10, and X each independently represents an acryloyl group, a methacryloyl group, a hydrogen atom or a carboxyl group.

In formula (i), the total number of the acryloyl groups and methacryloyl groups represented by X is 3 or 4, m each independently represents an integer from 0 to 10, and the total of each m is an integer from 0 to 40, provided that when the total of each m is 0, any one of Xs is a carboxyl group.

In formula (ii), the total number of the acryloyl groups and methacryloyl group represented by X is 5 or 6, n each independently represents an integer from 0 to 10, and the total of each n is an integer from 0 to 60, provided that when the total of each n is 0, any one of Xs is a carboxyl group.

In formula (i), m is preferably an integer from 0 to 6, and more preferably an integer from 0 to 4. The total of each m is preferably an integer from 2 to 40, more preferably an integer from 2 to 16, and particularly preferably an integer from 4 to 8.

In formula (ii), n is preferably an integer from 0 to 6, more preferably an integer from 0 to 4. The total of each n is preferably an integer from 3 to 60, more preferably an integer from 3 to 24, and particularly preferably an integer from 6 to 12.

Also, an embodiment wherein —(($CH_2$)$_y$$CH_2$O)— or —(($CH_2$)$_y$CH($CH_3$)O)— in formula (i) or (ii) is connected to X at the terminal on the oxygen atom side is preferred.

The compounds represented by formulae (i) and (ii) may be used individually or in combination of two or more thereof. In particular, an embodiment where all of six Xs in formula (ii) are acryloyl groups is preferred.

The compound represented by formula (i) or (ii) can be synthesized through a step of connecting a ring-opened skeleton of ethylene oxide or propylene oxide to pentaerythritol or dipentaerythritol by a ring-opening addition reaction, and a step of introducing a (meth)acryloyl group into the terminal hydroxyl group of the ring-opened skeleton by reacting, for example, (meth)acryloyl chloride, which are conventionally known steps. Each step is a well-known step and the compound represented by formula (i) or (ii) can be easily synthesized by those skilled in the art.

Of the compounds represented by formulae (i) and (ii), a pentaerythritol derivative and/or a dipentaerythritol derivative are more preferred.

Specifically, compounds represented by formulae (a) to (f) shown below (hereinafter, also referred to as Exemplary Compounds (a) to (f)) are exemplified and among them, Exemplary Compounds (a), (b), (e) and (f) are preferred.

In particular, Exemplary Compound (b) is effective as the polymerizable compound and can significantly increase the effect of the invention.

[Chem. 16]

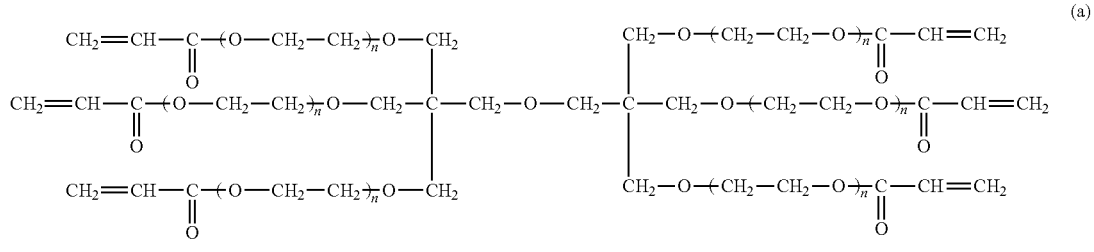

(total of each n is 6)

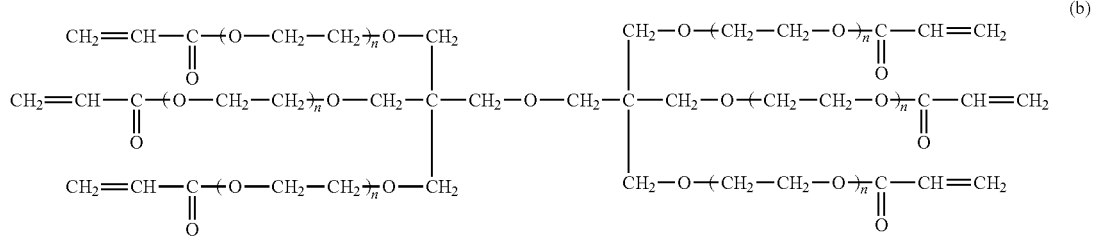

(total of each n is 12)

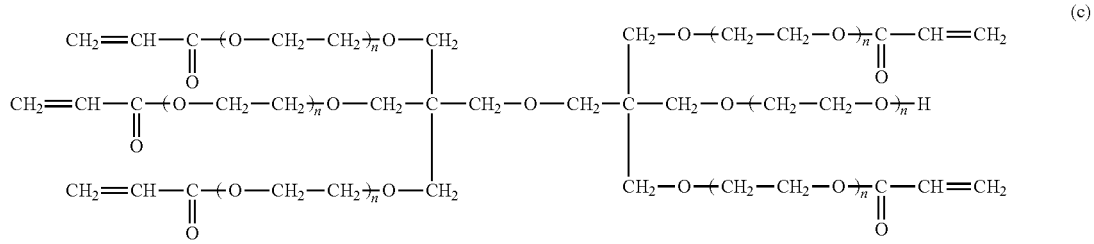

(total of each n is 12)

[Chem. 17]

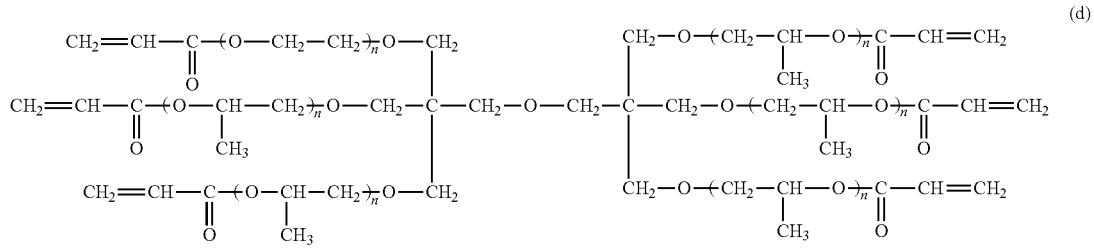

(total of each n is 6)

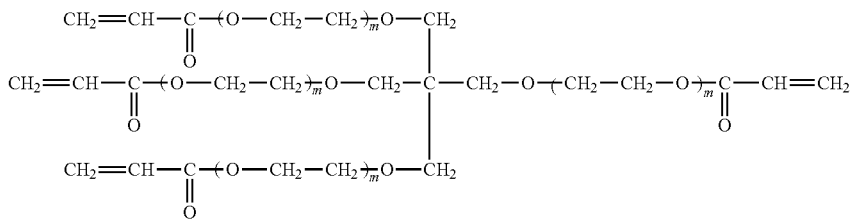

(e)

(total of each n is 4)

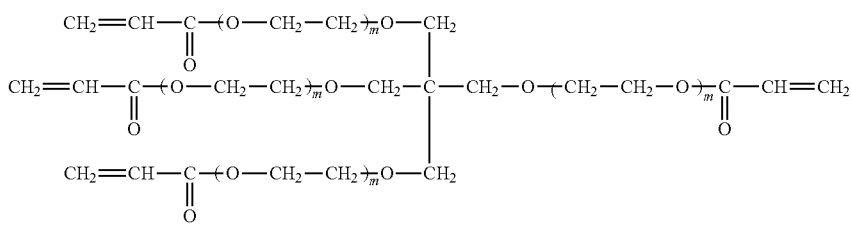

(f)

(total of each n is 12)

As commercial products of the polymerizable compound represented by formula (i) or (ii), for example, SR-494, which is a tetrafunctional acrylate having four ethylene oxy chains, produced by Sartomer Co., and DPCA-60, which is a hexafunctional acrylate having six pentylene oxy chains, and TPA-330, which is a trifunctional acrylate having three isobutylene oxy chains, both produced by Nippon Kayaku Co., Ltd. are exemplified.

Further, compounds presented as photocurable monomers and oligomers in *Journal of the Adhesion Society of Japan*, Vol. 20, No. 7, pages 300 to 308 can also be used as the polymerizable compound.

The content of the polymerizable compound in the composition for color filter is preferably from 2 to 50% by mass, more preferably from 2 to 30% by mass, still more preferably from 2 to 25% by mass, based on the total solid content of the composition.

<(E) Ultraviolet Absorbing Agent>

Further, the composition for color filter (typically, the colored radiation-sensitive composition) according to the invention preferably contains (E) an ultraviolet absorbing agent.

The ultraviolet absorbing agent is a compound having an extinction coefficient per 1 g at a wavelength of 365 nm of more than 100 and having an extinction coefficient per 1 g at a wavelength of 400 nm or more of 10 or less. The extinction coefficient is a value measured at a concentration of 0.01 g/L using ethyl acetate solvent by an ultraviolet visible spectrophotometer (Carry-5 Spectrophotometer produced by Varian, Inc.).

When the extinction coefficient per 1 g at a wavelength of 365 nm is 100 or less, the addition amount necessary for obtaining the ultraviolet absorbing effect increases to result in deterioration of prescription likelihood. It is not preferred that the extinction coefficient per 1 g at a wavelength of 400 nm exceeds 10, because the device spectroscopy in the visible region is affected.

As the ultraviolet absorbing agent for use in the invention, a compound represented by formula (I) shown below, which is a conjugated diene-based compound, is preferred. By using the conjugated dien-based compound, the change in the development performance especially after performing the exposure with a low illuminance is suppressed so that the dependency on the exposure illuminance which relates to the pattern forming property, for example, a linewidth of the pattern, a film thickness or a spectroscopic spectrum can be more effectively inhibited.

[Chem. 18]

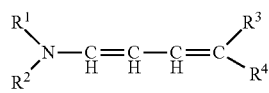

Formula (I)

In formula (I), $R^1$ and $R^2$ each independently represents a hydrogen atom, an alkyl group having from 1 to 20 carbon atoms or an aryl group having from 6 to 20 carbon atoms, and although $R^1$ and $R^2$ may be the same or different from each other, $R^1$ and $R^2$ do not represent hydrogen atoms at the same time.

The alkyl group represented by any of $R^1$ and $R^2$ may have a substituent, and as the substituent of the alkyl group having a substituent, for example, an alkyl group, an aryl group, an alkoxy group, an aryloxy group, an acyloxy group, a halogen atom, an acylamino group, an acyl group, an alkylthio group, an arylthio group, a hydroxy group, a cyano group, an alkyloxycarbonyl group, an aryloxycarbonyl group, a substituted carbamoyl group, a substituted sulfamoyl group, a nitro group, a substituted amino group, an alkyl sulfonyl group and an arylsulfonyl group are exemplified.

The aryl group having from 6 to 20 carbon atoms represented by any of $R^1$ and $R^2$ may be monocyclic or a condensed ring, and may be any of a substituted aryl group having a substituent and an unsubstituted aryl group.

Also, $R^1$ and $R^2$ may form a cyclic amino group together with a nitrogen atom. As the cyclic amino group, for example, a piperidino group, a morpholino group, a pyrrolidino group, a hexahydroazepino group and a piperazino group are exemplified.

Among them, $R^1$ and $R^2$ are each preferably a lower alkyl group having from 1 to 8 carbon atoms (for example, methyl, ethyl, isopropyl, butyl, sec-butyl, tert-butyl, pentyl, tert-pentyl, hexyl, octyl, 2-ethylhexyl or tert-octyl), or a substituted or unsubstituted phenyl group (for example, a tolyl group, a phenyl group, an anisyl group, a mesityl group, a chlorophenyl group or a 2,4-di-tert-amylphenyl group). It is also preferred that $R^1$ and $R^2$ are connected to form a ring containing the nitrogen atom represented by N in the formula (for example, a piperidine ring, a pyrrolidine ring or a morpholine ring).

In formula (I), $R^3$ and $R^4$ each represents an electron-withdrawing group. Here, the electron-withdrawing group is an electron-withdrawing group having a Hammett's substituent constant, $\sigma_p$ value (hereinafter, simply referred to as "$\sigma_p$ value") from 0.20 to 1.0. The electron-withdrawing group is preferably an electron-withdrawing group having a $\sigma_p$ value from 0.30 to 0.8.

The Hammett's rule is an empirical rule proposed by L. P. Hammett in 1935 in order to quantitatively discuss the influence of substituent exerted on the reaction or equilibrium of a benzene derivative, and the validity of the rule is widely recognized today. The substituent constant determined by the Hammett's rule includes the $\sigma_p$ value and the $\sigma_m$ value, and these values are described in many general books and the details of which are described, for example, in J. A. Dean, Ed., *Lange's Handbook of Chemistry*, 12th Edition, 1979 (The McGraw-Hill Book Co.), *Kaaku no Ryoiki, Special Edition* No. 122, pages 96 to 103, 1979 (Nankodo Co., Ltd.) and *Chemical Review*, Vol. 91, pages 165 to 195, 1991. According to the invention, it is not meant that the substituents are limited only to the substituents having the known value described in the books, and a substituent is certainly included, the value of which is not known in the literature but the value of which falls within the range when measured on the basis of the Hammett's rule.

As specific examples of the electron-withdrawing group having the $\sigma_p$ value from 0.20 to 1.0, an acyl group, an acyloxy group, a carbamoyl group, an alkyloxycarbonyl group, an aryloxycarbonyl group, a cyano group, a nitro group, a dialkylphosphono group, a diarylphosphono group, a diarylphosphinyl group, an alkylsulfinyl group, an arylsulfinyl group, an alkylsulfonyl group, an arylsulfonyl group, a sulfonyloxy group, an acylthio group, a sulfamoyl group, a thiocyanate group, a thiocarbonyl group, an alkyl group substituted with two or more halogen atoms, an alkoxy group substituted with two or more halogen atoms, an aryloxy group substituted with two or more halogen atoms, an alkylamino group substituted with two or more halogen atoms, an alkylthio group substituted with two or more halogen atoms, an aryl group substituted with other electron-withdrawing group having the $\sigma_p$ value of 0.20 or more, a heterocyclic group, a chlorine atom, a bromine atom, an azo group and a selenocyanate group are exemplified. Of the substituents, groups capable of further having a substituent may further have the substituent described above.

According to the invention, in formula (I) described above $R^3$ is preferably a group selected from a cyano group, —$COOR^5$, —$CONHR^5$, —$COR^5$ and —$SO_2R^5$, and $R^4$ is preferably a group selected from a cyano group, —$COOR^6$, —$CONHR^6$, —$COR^6$ and —$SO_2R^6$. $R^5$ and $R^6$ each independently represents an alkyl group having from 1 to 20 carbon atoms or an aryl group having from 6 to 20 carbon atoms. The alkyl group having from 1 to 20 carbon atoms and the aryl group having from 6 to 20 carbon atoms, which are represented by $R^5$ and $R^6$, have the same meanings as defined in the case of $R^1$ and $R^2$, respectively, and preferred embodiments are also the same.

Among them, each of $R^3$ and $R^4$ is preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group or a sulfamoyl group, and particularly preferably an acyl group, a carbamoyl group, an alkyloxycarbonyl group, an aryloxycarbonyl group, a cyano group, an alkylsulfonyl group, an arylsulfonyl group, a sulfonyloxy group or a sulfamoyl group.

Moreover, $R^3$ and $R^4$ may be combined with each other to form a ring.

Furthermore, the compound described above may be in the form of a polymer derived from a monomer in which at least one of $R^1$, $R^2$, $R^3$ and $R^4$ is connected to a vinyl group through a connecting group. Also, it may be a copolymer with other monomer.

In the case of the copolymer, the other monomer includes, for example, acrylic acid, α-chloroacrylic acid, an α-alacrylic acid (for example, an ester derived from an acrylic acid, for example, methacrylic acid, preferably a lower alkyl ester, or an amide (for example, acrylamide, methacrylamide, tert-butylacrylamide, methyl acrylate, methyl methacrylate, ethyl acrylate, ethyl methacrylate, n-propyl acrylate, n-butyl acrylate, 2-ethylhexyl acrylate, n-hexyl acrylate, octyl methacrylate, lauryl methacrylate or methylene bisacrylamide)), a vinyl ester (for example, vinyl acetate, vinyl propionate or vinyl laurate), acrylonitrile, methacrylonitrile, an aromatic vinyl compound (for example, styrene or a derivative thereof, e.g., vinyl toluene, divinyl benzene, vinyl acetophenone, sulfostyrene or styrenesulfinic acid), itaconic acid, citraconic acid, crotonic acid, vinylidene chloride, a vinyl alkyl ether (for example, vinyl ethyl ether), a maleic ester, N-vinyl-2-pyrrolidone, N-vinylpyridine and 2- or 4-vinylpyridine.

Of the monomers, an acrylate, a methacrylate and an aromatic vinyl compound are particularly preferred.

Two or more comonomer compounds can be used in combination. For example, n-butyl acrylate and divinyl benzene, styrene and methyl methacrylate, and methyl acrylate and methacrylate acid are used.

Preferred specific examples [Exemplary compounds (1) to (14)] of the compound presented by formula (I) described above are set forth below, but the invention should not be construed as being limited thereto.

[Chem. 19]

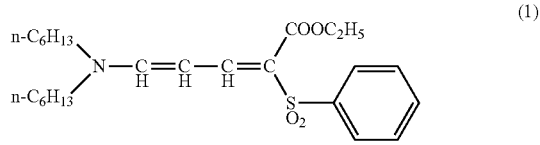

(1)

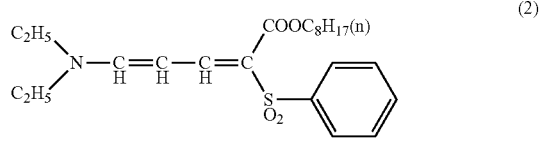

(2)

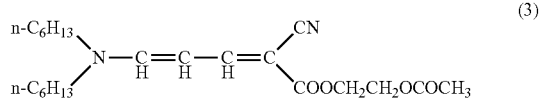

(3)

-continued (4)
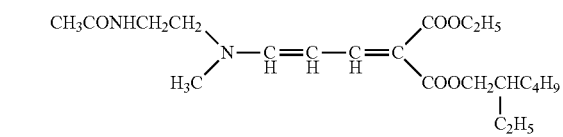

(5)
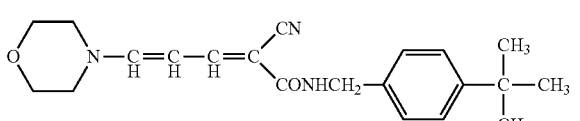

(6)
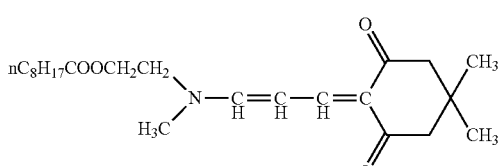

[Chem. 20]

(7)
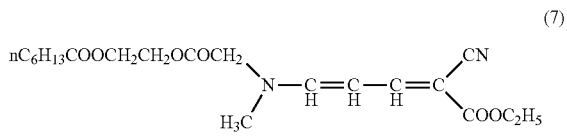

(8)
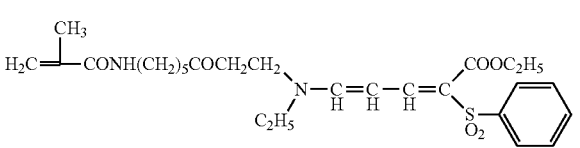

(9)
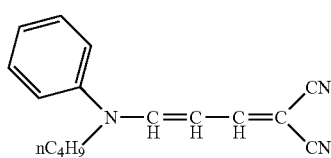

(10)
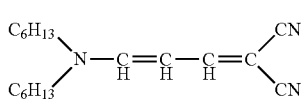

(11)
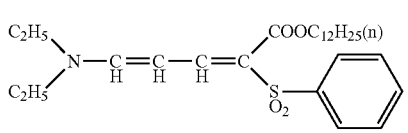

(12)
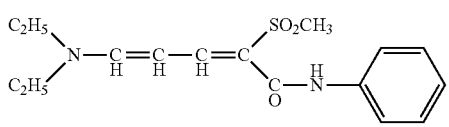

(13)
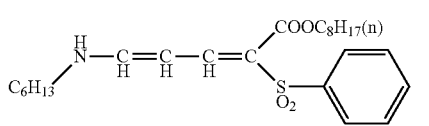

-continued
[Chem. 21]

(14)
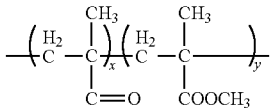

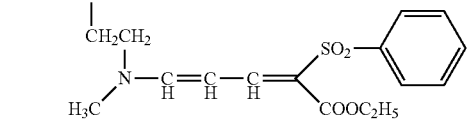

x:y = 80:20 (mass ratio)

The compound represented by formula (I) described above can be synthesized according to methods described in JP-B-44-29620, JP-A-53-128333, JP-A-61-169831, JP-A-63-53543, JP-A-63-53544 and JP-A-63-56651.

According to the invention, the ultraviolet absorbing agents described above may be used individually or in combination of two or more thereof.

The composition for color filter may or may not contain the ultraviolet absorbing agent. In the case of containing the ultraviolet absorbing agent, the content of the ultraviolet absorbing agent is preferably from 0.01 to 10%, more preferably from 0.01 to 5%, in terms of mass, based on the total solid content mass of the composition according to the invention.

When the content of the ultraviolet absorbing agent is smaller than the range described above, roughness of side wall in the colored pattern is deteriorated so that the fine pattern configuration (particularly, rectangle) cannot be finely formed. When the content exceeds the range described above, the sensitivity decreases.

A ratio (E/C) of the ultraviolet absorbing agent (E) to the photopolymerization initiator (C) is from 0.25 to 1.25 on a mass basis. When the E/C ratio is less than 0.25, roughness of side wall in the colored pattern is deteriorated so that the fine pattern configuration (particularly, rectangle) cannot be finely formed. When the ratio exceeds 1.25, the sensitivity decreases. From the same reason as described above, the E/C ratio is preferably in a range from 03 to 1.1, and more preferably in a range from 0.4 to 1.0.

The composition according to the invention can further contain a component, for example, (F) an alkali-soluble resin, an organic solvent or a surfactant.

<(F) Alkali-Soluble Resin>

The composition for color filter (typically, the colored radiation-sensitive composition) according to the invention preferably further contains (F) an alkali-soluble resin. By incorporating the alkali-soluble resin, the development property and the pattern forming property are improved.

The alkali-soluble resin may be a linear high molecular polymer, and can be appropriately selected from alkali-soluble resins containing at least one group which accelerates alkali solubility in the molecules thereof (preferably, molecule containing an acrylic copolymer or a styrene-based copolymer as the main chain).

The alkali-soluble resin will be described.

As the alkali-soluble resin, from the standpoint of heat resistance, a polyhydroxystyrene-based resin, a polysiloxane-based resin, an acrylic resin, an acrylamide-based resin and an acrylic/acrylamide copolymer resin are preferred, and from the standpoint of controlling development property, an acrylic resin, an acrylamide-based resin and an acrylic/acrylamide copolymer resin are preferred.

As the group which accelerates alkali solubility (hereinafter, also referred to as an acid group), for example, a carboxyl group, a phosphoric acid group, a sulfonic acid group and a phenolic hydroxy group are exemplified. The group which is soluble in an organic solvent and enables development with an aqueous weak alkali solution is preferred, and (meth)acrylic acid is particularly preferably exemplified. The acid groups may be used only one kind or two or more kinds thereof in combination.

As a monomer which provides an acid group after the polymerization, for example, a monomer having a hydroxy group, for example, 2-hydroxyethyl (meth)acrylate, a monomer having an epoxy group, for example, glycidyl (meth) acrylate, and a monomer having an isocyanate group, for example, 2-isocyanatoethyl (meth)acrylate are exemplified. The monomers for introducing an acid group may be used only one kind or two or more kinds thereof in combination. In order to introduce the acid group into the alkali-soluble binder, for example, a monomer having an acid group and/or a monomer which can provide an acid group after polymerization (hereinafter, also referred to as a "monomer for introducing an acid group") can be polymerized as a monomer component. In the case of introducing an acid group using the monomer which can provide an acid group after polymerization as a monomer component, it is required to perform, for example, a treatment for providing an acid group described later after the polymerization.

For the production of alkali-soluble resin, for example, a method by a known radical polymerization method can be applied. Polymerization conditions, for example, temperature, pressure, a kind and an amount of a radical initiator or a kind of a solvent in the production of alkali-soluble resin by the radical polymerization method can be easily set by those skilled in the art, or it is also possible to experimentally determine the conditions.

As the alkali-soluble resin, a polymer having a carboxylic acid in the side chain is preferred and as to such a polymer, description of Paragraph No. [0253] of JP-A-2012-162684 and the like can be referred to and the contents thereof are incorporated herein by reference.

The alkali-soluble resin preferably contains Resin (a) having a repeating unit derived from a compound represented by formula (ED) shown below (hereinafter, also referred to as a "ether dimer" sometimes).

By using Resin (a), the composition according to the invention is able to exhibit good PCD dependency.

[Chem. 22]

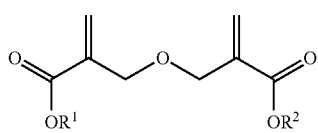

(ED)

In formula (ED), $R^1$ and $R^2$ each independently represents a hydrogen atom or a hydrocarbon group.

The hydrocarbon group represented by any of $R^1$ and $R^2$ in formula (ED) is preferably a hydrocarbon group having from 1 to 25 carbon atoms.

Also, the hydrocarbon group may have a substituent.

The hydrocarbon group is not particularly limited and, for example, a straight-chain or branched alkyl group, for example, methyl, ethyl, n-propyl, isopropyl, n-butyl, isobutyl, tert-butyl, tert-amyl, stearyl, lauryl or 2-ethylhexyl; an aryl group, for example, phenyl; an alicyclic group, for example, cyclohexyl, tert-butylcyclohexyl, dicyclopentadienyl, tricyclodecanyl, isobornyl, adamantyl or 2-methyl-2-adamantyl; an alkyl group substituted with an alkoxy group, for example, 1-methoxyethyl or 1-ethoxyethyl, and an alkyl group substituted with an aryl group, for example, benzyl are exemplified. Among them, a substituent of a primary or secondary carbon which is difficult to be released upon an acid or heat, for example, methyl, ethyl, cyclohexyl or benzyl is particularly preferred from the standpoint of heat resistance.

As to specific examples of the ether dimer, description of Paragraph No. [0257] of JP-A-2012-162684 and the like can be referred to and the contents thereof are incorporated herein by reference.

The ratio of the ether dimer in the monomers for obtaining Resin (a) is not particularly limited and it is preferably from 2 to 60% by mass, more preferably from 5 to 55% by mass, still more preferably from 5 to 50% by mass, based on the total monomer component.

Resin (a) may be a copolymer in which other monomer is copolymerized together with the ether dimer.

As the other monomer copolymerizable with the ether dimer, for example, a monomer for introducing an acid group, a monomer for introducing a radical polymerizable double bond, a monomer for introducing an epoxy group and a copolymerizable monomer other than those described above are exemplified. Such monomers may be used only one kind or two or more kinds thereof in combination.

As the monomer for introducing an acid group, for example, a monomer having a carboxyl group, for example, (meth)acrylic acid or itaconic acid, a monomer having a phenolic hydroxy group, for example, N-hydroxyphenylmaleimide, and a monomer having a carboxylic acid anhydride, for example, maleic anhydride or itaconic anhydride are exemplified. Among them, (meth)acrylic acid is particularly preferred.

The monomer for introducing an acid group may be a monomer which provides an acid group after the polymerization and, for example, a monomer having a hydroxy group, for example, 2-hydroxyethyl (meth)acrylate, a monomer having an epoxy group, for example, glycidyl (meth) acrylate, and a monomer having an isocyanate group, for example, 2-isocyanatoethyl (meth)acrylate are exemplified. In the case of using a monomer for introducing a radical polymerizable double bond, in the case of using a monomer for introducing an acid group which can provide an acid group after the polymerization, it is required to perform a treatment for providing an acid group after the polymerization. The treatment for providing an acid group after the polymerization is different depending on the kind of the monomer and, for example, the treatments described below are exemplified. In the case of using a monomer having a hydroxy group, for example, a treatment of adding an acid anhydride, for example, succinic anhydride, tetrahydrophthalic anhydride or maleic anhydride is exemplified. In the case of using a monomer having an epoxy group, for example, a treatment of adding a compound having an amino group and an acid group, for example, N-methylaminobenzoic acid or N-methylaminophenol, or a treatment in which an acid anhydride, for example, succinic anhydride, tetrahydrophthalic anhydride or maleic anhydride is added to a hydroxy group formed after adding an acid, for example, (meth)acrylic acid is exemplified. In the case of using a monomer having an isocyanate group, for example, a treatment of adding a compound having a hydroxy group and an acid group, for example, 2-hydroxybutyric acid is exemplified.

In the case where the monomer for obtaining Resin (a) contains a monomer for introducing an acid group, the content ratio of monomer for introducing an acid group is not particularly limited, and it is preferably from 5 to 70% by mass, more preferably from 10 to 60% by mass, in the total monomer component.

As the monomer for introducing the radical polymerizable double bond, for example, a monomer having a carboxyl group, for example, (meth)acrylic acid or itaconic acid; a monomer having a carboxylic acid anhydride, for example, maleic anhydride or itaconic anhydride; and a monomer having an epoxy group, for example, glycidyl (meth)acrylate, 3,4-epoxycyclohexylmethyl (meth)acrylate or o-(or m-, or p-)vinylbenzyl glycidyl ether are exemplified. In the case of using the monomer for introducing the radical polymerizable double bond, it is required to perform a treatment for providing the radical polymerizable double bond after the polymerization. The treatment for providing the radical polymerizable double bond after the polymerization is different depending on the kind of monomer for introducing the radical polymerizable double bond used and, for example, the treatments described below are exemplified. In the case of using a monomer having a carboxyl group, for example, (meth)acrylic acid or itaconic acid, a treatment of adding a compound having an epoxy group and a radical polymerizable double bond, for example, glycidyl (meth)acrylate, 3,4-epoxycyclohexylmethyl (meth)acrylate or o-(or m-, or p-)vinylbenzyl glycidyl ether is exemplified. In the case of using a monomer having a carboxylic acid anhydride, for example, maleic anhydride or itaconic anhydride, a treatment of adding a compound having a hydroxy group and a radical polymerizable double bond, for example, 2-hydroxyethyl (meth)acrylate is exemplified. In the case of using a monomer having an epoxy group, for example, glycidyl (meth)acrylate, 3,4-epoxycyclohexylmethyl (meth)acrylate or o-(or m-, or p-)vinylbenzyl glycidyl ether, a treatment of adding a compound having an acid group and a radical polymerizable double bond, for example, (meth)acrylic acid is exemplified.

In the case where the monomer for obtaining Resin (a) contains the monomer for introducing the radical polymerizable double bond, the content ratio of the monomer for introducing the radical polymerizable double bond is not particularly limited, and it is preferably from 5 to 70% by mass, more preferably from 10 to 60% by mass, in the total monomer component.

As the monomer for introducing an epoxy group, for example, glycidyl (meth)acrylate, 3,4-epoxycyclohexylmethyl (meth)acrylate and o-(or m-, or p-)vinylbenzyl glycidyl ether are exemplified.

In the case where the monomer for obtaining Resin (a) contains the monomer for introducing the epoxy group, the content ratio of the monomer for introducing the epoxy group is not particularly limited, and it is preferably from 5 to 70% by mass, more preferably from 10 to 60% by mass, in the total monomer component.

As to the other copolymerizable monomer, description of Paragraph No. [0328] of JP-A-2012-46629 and the like can be referred to and the contents thereof are incorporated herein by reference.

In the case where the monomer for obtaining Resin (a) contains the other copolymerizable monomer, the content ratio of the other copolymerizable monomer is not particularly limited, and it is preferably 95% by mass or less, more preferably 85% by mass or less.

The weight average molecular weight of Resin (a) is not particularly limited and, from the standpoint of viscosity of the colored radiation-sensitive composition and heat resistance of the coated film formed from the composition, it is preferably from 2,000 to 200,000, more preferably from 5,000 to 100,000, and still more preferably from 5,000 to 20,000.

Also, in the case where Resin (a) has an acid group, the acid value thereof is preferably from 30 to 500 mgKOH/g, and more preferably from 50 to 400 mgKOH/g.

Resin (a) can be easily obtained by polymerizing at least the monomer essentially containing the ether dimer. At the time of the polymerization, a cyclization reaction of the ether dimer simultaneously proceeds to form a tetrahydropyran ring structure.

The polymerization method applied to the synthesis of Resin (a) is not particularly limited, and various polymerization methods conventionally known can be adopted. In particularly, a solution polymerization method is preferred. In detail, Resin (a) can be synthesized, for example, in accordance with the synthesis method of Resin (a) described in JP-A-2004-300204.

Exemplary compounds of Resin (a) are set forth below, but the invention should not be construed as being limited thereto. The composition ratio of the exemplary compound shown below is indicated as mole percent

[Chem. 23]

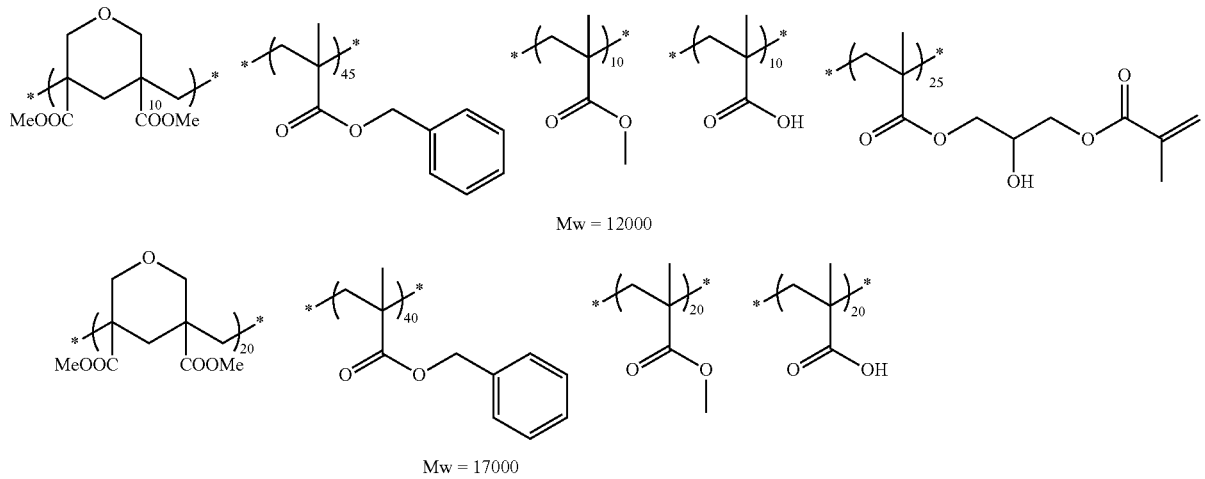

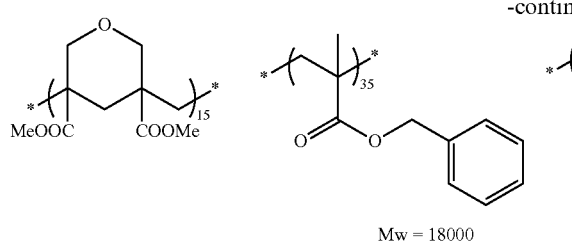

[Chem. 24]

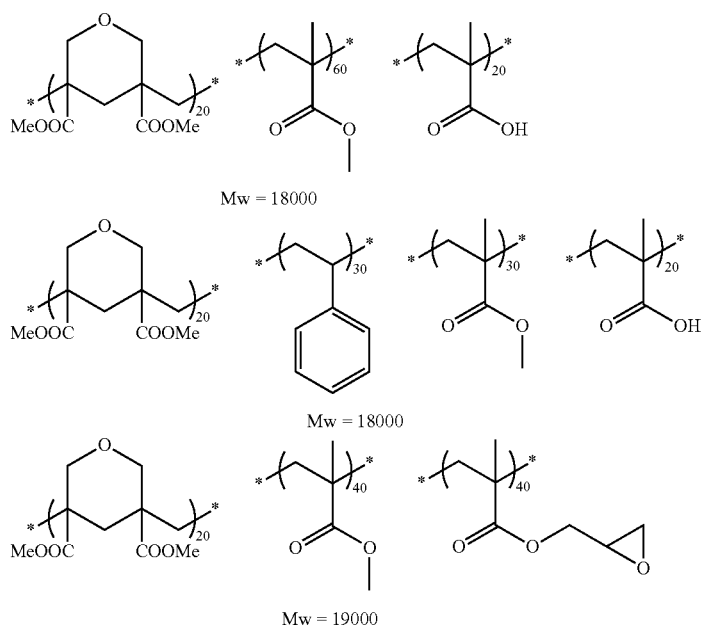

Of the alkali-soluble resins, in particular, a benzyl (meth)acrylate/(meth)acrylic acid copolymer or a multicomponent copolymer composed of benzyl (meth)acrylate/(meth)acrylic acid/other monomer is preferable. In addition, a copolymer in which 2-hydroxyethylmetacrylate is copolymerized, and a 2-hydroxypropyl (meth)acrylate/polystyrene macromonomer/benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer and a 2-hydroxyethyl methacrylate/polystyrene macromonomer/benzyl methacrylate/methacrylic acid copolymer described in JP-A-7-140654 are exemplified.

In order to improve the crosslinking efficiency of the composition according to the invention, an alkali-soluble resin having a polymerizable group may also be used.

As the alkali-soluble resin having a polymerizable group, for example, an alkali-soluble resin containing an allyl group, a (meth)acryl group, an allyloxyalkyl group or the like in its side chain is useful. As the alkali-soluble resin having a polymerizable group, for example, a urethane-modified polymerizable double bond-containing acrylic resin obtained by reacting a compound having one unreacted isocyanate group remaining after reacting an isocyanate group with an OH group and containing a (meth)acryloyl group with an acrylic resin containing a carboxyl group, an unsaturated group-containing acrylic resin obtained by reacting an acrylic resin containing a carboxyl group with a compound having both an epoxy group and a polymerizable double bond in its molecule, an acid pendant type epoxy-acrylate resin, a polymerizable double bond-containing acrylic resin in which an acrylic resin containing an OH group and a dibasic acid anhydride having a polymerizable double bond are reacted, a resin in which an acrylic resin containing an OH group, isocyanate and a compound having a polymerizable group are reacted, and a resin obtained by performing a basic treatment of a resin having in its side chain, an ester group which has a releasing group, for example, a halogen atom or a sulfonate group at an α-position or a β-position described in JP-A-2002-229207 and JP-A-2003-335814 are preferred.

The acid value of the alkali-soluble resin is preferably from 30 to 200 mgKOH/g, more preferably from 50 to 150 mgKOH/g, and most preferably from 70 to 120 mgKOH/g.

Also, the weight average molecular weight (Mw) of the alkali-soluble resin is preferably from 2,000 to 50,000, more preferably from 5,000 to 30,000, and most preferably from 7,000 to 20,000.

The content of the alkali-soluble resin in the composition for color filter is preferably from 1 to 15% by mass, more preferably from 2 to 12% by mass, particularly preferably from 3 to 10% by mass, based on the total solid content of the composition.

<(G) Organic Solvent>

The composition (typically, the colored radiation-sensitive composition) according to the invention preferably contains (G) an organic solvent.

As examples of the organic solvent (G), for example, organic solvents described below are exemplified.

As an ester, for example, ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, an alkyl oxyacetate (for example, methyl oxyacetate, ethyl oxyacetate, butyl oxyacetate (for example, methyl methoxyacetate, ethyl methoxyacetate, butyl methoxyacetate, methyl ethoxyacetate or ethyl ethoxyacetate)), an alkyl 3-oxypropionate (for example, methyl 3-oxypropionate or ethyl 3-oxypropionate (for example, methyl 3-methoxypropionate, ethyl 3-methoxypropionate, methyl 3-ethoxypropionate or ethyl 3-ethoxypropionate)), an alkyl 2-oxypropionate (for example, methyl 2-oxypropionate, ethyl 2-oxypropionate, propyl 2-oxypropionate (for example, methyl 2-methoxypropionate, ethyl 2-methoxypropionate, propyl 2-methoxypropionate, methyl 2-ethoxypropionate or ethyl 2-ethoxypropionate)), methyl 2-oxy-2-methylpropionate, ethyl 2-oxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate or ethyl 2-oxobutanoate; as an ether, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate or propylene glycol monopropyl ether acetate; as a ketone, for example, methyl ethyl ketone, cyclohexanone, 2-heptanone or 3-heptanone; and as an aromatic hydrocarbon, for example, toluene or xylene are preferably exemplified.

The organic solvents may be used individually or in combination of two or more thereof.

In the case of using two or more organic solvents in combination, a mixed solution composed of two or more solvents selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate is particularly preferred.

The amount of the organic solvent contained in the composition for color filter is preferably from 10 to 90% by mass, more preferably from 20 to 80% by mass, still more preferably from 25 to 75% by mass, based on the total amount of the composition.

<Sensitize>

The composition for color filter (typically, the colored radiation-sensitive composition) according to the invention may contain a sensitizer for the purpose of increasing the initiation species generation efficiency of the polymerization initiator and shifting a photosensitive wavelength to a long wavelength side. As the sensitizer, a sensitizer having an absorption wavelength in a wavelength range from 300 to 450 nm is exemplified.

As the sensitizer, for example, a polynuclear aromatic compound, for example, phenanthrene, anthracene, pyrene, perylene, triphenylene or 9,10-dialkoxyanthracene, a xanthene, for example, fluorescein, eosin, erythrosine, rhodamine B or rose bengal, a thioxanthone, a cyanine, a merocyanine, a phthalocyanine, a thiazine, for example, thionine, methylene blue or toluidine blue, an acridine, an anthraquinone, a squarylium, a coumarin, a phenothiazine, a phenazine, a styrylbenzene, an azo compound, diphenylmethane, triphenylmethane, a distyrylbenzene, a carbazole, porphyrin, a spiro compound, quinacridone, indigo, styryl, a pyrylium compound, a pyrromethene compound, a pyrazolotriazole compound, a benzothiazole compound, a barbituric acid derivative, a thiobarbituric acid derivative, an aromatic ketone compound, for example, acetophenone, benzophenone or Michler's ketone, and a heterocyclic compound, for example, N-aryloxazolidinone are exemplified.

<Chain Transfer Agent>

It is preferred to add a chain transfer agent to the composition for color filter (typically, the colored radiation-sensitive composition) according to the invention depending on the photopolymerization initiator used. As the chain transfer agent, an alkyl N,N-dialkylaminobenzoate and a thiol-based compound are exemplified. As the thiol-based compound, for example, 2-mercaptobenzothiazole, 2-mercapto-1-phenylbenzimidazole and 3-mercaptopropionic acid can be used individually or as a combination of two or more thereof.

<Polymerization Inhibitor>

It is desired to add a small amount of polymerization inhibitor to the composition for color filter (typically, the colored radiation-sensitive composition) according to the invention in order to prevent undesirable thermal polymerization of the polymerizable compound during the production or preservation of the colored radiation-sensitive composition.

As the polymerization inhibitor which can be used in the invention, for example, hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and cerium (I) salt of N-nitrosophenylhydroxylamine are exemplified. Among them, p-methoxyphenol is preferred.

The addition amount of the polymerization inhibitor is preferably from about 0.01% to about 5% by mass based on the mass of the composition.

<Substrate Adhesion Agent>

Moreover, according to the invention, a substrate adhesion agent capable of increasing adhesion to substrate may be added to the composition for color filter (typically, the colored radiation-sensitive composition).

As the substrate adhesion agent, a silane-based coupling agent, a titanate-based coupling agent or an aluminum-based coupling agent is preferably used. As the silane-based coupling agent, for example, γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane and phenyltrimethoxysilane are exemplified. Among them, γ-methacryloxypropyltrimethoxysilane is preferred as the substrate adhesion agent.

The content of the substrate adhesion agent is preferably from 0.1 to 30% by mass, more preferably from 0.5 to 20% by mass, particularly preferably from 1 to 10% by mass, based on the total solid content of the composition for color filter according to the invention from the standpoint of leaving no residues in the unexposed area when the composition for color filter is exposed and developed.

<Surfactant>

To the composition for color filter (typically, the colored radiation-sensitive composition) according to the invention may be added various surfactants from the standpoint of more improving a coating property. As the surfactant, various surfactants, for example, a fluorine-based surfactant, a nonionic surfactant, a cationic surfactant, an anionic surfactant and a silicone-based surfactant can be used.

In particular, when the composition for color filter contains a fluorine-based surfactant, liquid characteristic (particularly, fluidity) of a coating solution prepared is more enhanced so that uniformity of the coating thickness or liquid saving property can be more improved.

Specifically, in the case of forming a film by using a coating solution prepared from the composition containing a fluorine-based surfactant, the interface tension between the surface to be coated and the coating solution is reduced, whereby wettability to the surface to be coated is improved and the coating property on the surface to be coated is enhanced. This is effective in that even when a thin film of about several μm is formed with a small liquid volume, a film formation with little thickness unevenness and a uniform thickness can be more preferably performed.

The fluorine content in the fluorine-based surfactant is preferably from 3 to 40% by mass, more preferably from 5 to 30% by mass, and particularly preferably from 7 to 25% by mass. The fluorine-based surfactant having the fluorine content in the range described above is effective in view of the uniformity of the coating film thickness and the liquid saving property, and the solubility thereof in the composition is good.

As the fluorine-based surfactant, for example, MEGAFAC F171, MEGAFAC F172, MEGAFAC F173, MEGAFAC F176, MEGAFAC F177, MEGAFAC F141, MEGAFAC F142, MEGAFAC F143, MEGAFAC F144, MEGAFAC R30, MEGAFAC F437, MEGAFAC F475, MEGAFAC F479, MEGAFAC F482, MEGAFAC F554, MEGAFAC F780 and MEGAFAC F781 (all produced by DIC Corp.), FLUORAD FC430, FLUORAD FC431 and FLUORAD FC171 (all produced by Sumitomo 3M Ltd.), and SURFLON S-382, SURFLON SC-101, SURFLON SC-103, SURFLON SC-104, SURFLON SC-105, SURFLON SC-1068, SURFLON SC-381, SURFLON SC-383, SURFLON S393 and SURFLON KH-40 (all produced by Asahi Glass Co., Ltd.) are exemplified.

As the nonionic surfactant, specifically, for example, glycerol, trimethylolpropane, trimethylolethane, or ethoxylate or propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and a sorbitan fatty acid ester (for example, PLURONIC L10, L31, L61, L62, 10R5, 17R2 and 25R2, TETRONIC 304, 701, 704, 901, 904 and 150R1 (all produced by BASF Corp.) or SOLSPERSE 20000 (produced by Lubrizol Japan Ltd.)) are exemplified.

As the cationic surfactant, specifically, for example, a phthalocyanine derivative (EFKA-745 produced by Morishita & Co., Ltd.), Organosiloxane Polymer KP341 (produced by Shin-Etsu Chemical Co., Ltd.), a (meth)acrylic acid (co)polymer (POLYFLOW No. 75, No. 90 and No. 95 (produced by Kyoeisha Chemical Co., Ltd.), and W001 (produced by Yusho Co., Ltd.) are exemplified.

As the anionic surfactant, for example, W004, W005 and W017 (produced by Yusho Co., Ltd.) are exemplified.

As the silicone-based surfactant, for example, TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA and TORAY SILICONE SH8400 (all produced by Dow Corning Toray Silicone Co., Ltd.), TSF-4440, TSF-4300, TSF-4445, TSF-4460 and TSF-4452 (all produced by Momentive Performance Materials Inc.), KP341, KF6001 and KF6002 (all produced by Shin-Etsu Silicone Co., Ltd.), and BYK307, BYK323 and BYK330 (all produced by BYK-Chemie GmbH).

The surfactants may be used only one kind or in combination of two or more kinds thereof.

The addition amount of the surfactant is preferably from 0.001 to 2.0% by mass, more preferably from 0.005 to 1.0% by mass, based on the total solid content of the composition for color filter.

<Other Components>

The composition for color filter (typically, the colored radiation-sensitive composition) according to the invention is able to contain, if desired, various additives, for example, a chain transfer agent, for example, an alkyl N,N-dialkylaminobenzoate or 2-mercaptobenzothiazole, a thermal polymerization initiator, for example, an azo-based compound or a peroxide-based compound, a thermal polymerizable component, a polyfunctional thiol or an epoxy compound for the purpose of enhancing film strength or sensitivity, an ultraviolet absorbing agent, for example, an alkoxybenzophenone, a plasticizer, for example, dioctyl phthalate, a development property improving agent, for example, a low molecular weight organic carboxylic acid, other filling agent, a polymer compound other than the specific binder and the alkali-soluble resin described above, an antioxidant, or an aggregation inhibitor.

Also, a heat curing agent can also be added in order to increase the curing degree of the film by post-heating after the development. As the heat curing agent, a thermal polymerization initiator, for example, an azo compound or a peroxide, a novolak resin, a resole resin, an epoxy compound and a styrene compound are exemplified.

As to the composition for color filter according to the invention, it is preferred that when a film having a film thickness of 0.5 μm is formed, a maximum value of a light transmittance in the film thickness direction in a wavelength range from 400 to 650 nm is 20% or less and a minimum value of a light transmittance in the film thickness direction in a wavelength range from 800 to 1,300 nm is 80% or more.

The condition relating to the light transmittance described above may be achieved by any means. For example, the condition relating to the light transmittance described above can be preferably achieved by controlling the kind and content of the near-infrared transmitting black coloring agent (more specifically, by controlling the kind and content of the near-infrared transmitting black coloring agent to those preferred described above).

Also, as to the composition for color filter according to the invention, it is preferred that when a film having a film thickness of 0.5 μm is formed, a standard deviation of a light transmittance in the film thickness direction in a wavelength range from 400 to 630 nm is 6.0 or less. The standard deviation is more preferably 4.0 or less, and particularly preferably 3.0 or less.

The condition relating to the light transmittance described above may be achieved by any means. For example, it can be preferably achieved by using a bisbenzofuranone-based pigment as the near-infrared transmitting black coloring agent and setting the pigment concentration in the film in a range preferably from 20 to 80% by mass, more preferably from 40 to 80% by mass, and particularly preferably from 50 to 80% by mass.

Further, by using the near-infrared transmitting black coloring agent in combination with a coloring agent of chromatic color as the coloring agent (B) as described above, the standard deviation can be more decreased

[Preparation of Colored Radiation-Sensitive Composition]

As to the composition for color filter according to the invention, the near-infrared transmitting black coloring agent (in the case where the near-infrared transmitting black coloring agent is a near-infrared transmitting black pigment, it is preferred to use a pigment dispersion liquid previously prepared) is mixed with stirring together with a photopolymerization initiator, a polymerizable compound, and if desired, each component, for example, an ultraviolet absorbing agent, an alkali-soluble resin or a surfactant, and if desired, is subjected to filtration as described below, thereby preparing the colored radiation-sensitive composition.

The colored radiation-sensitive composition according to the invention is preferably filtered using a filter for the purpose of removing a foreign substance, reducing a defect or the like. Anything which has been used for filtering can be used without a particular limitation. For example, filters of a fluorine resin, for example, PTFE (polytetrafluoroethylene), a polyamide-based resin, for example, nylon 6 or nylon 6,6, a polyolefin resin, for example, polyethylene or polypropylene (including high-density or ultra-high-molecular weight) and the like are exemplified. Of the materials, polypropylene (including high-density polypropylene) is preferred.

The pore diameter of the filter is suitably approximately from 0.01 to 7.0 µm, preferably approximately from 0.01 to 2.5 µm, and more preferably approximately from 0.01 to 2.0 µm. In the range described above, a fine foreign substance which inhibits the preparation of uniform and smooth colored radiation-sensitive composition in a post-step can be certainly removed.

In the case of using a filter, the filter may be combined with other filter. In that case, filtering in a first filter may be conducted only once, or twice or more.

Also, the first filters having different pore diameters within the range described above may be combined with each other. The pore diameter can refer to the nominal value of the filter manufacturer. The commercially available filter can be selected from various filters provided, for example, by Nihon Pall Ltd., Advantec Toyo Kaisha, Ltd., Nihon Entegris K.K. (former Mykrolis Corp.) and Kitz Microfilter Corp.

As a second filter, a filter formed from the same material of the first filter described above can be used.

For example, the filtering in the first filter may be conducted only with the dispersion liquid and the second filtering may be conducted after mixing other components.

[Production of Infrared Transmission Filter by Colored Radiation-Sensitive Composition]

Next, the infrared transmission filter according to the invention and production method thereof are described.

The infrared transmission filter according to the invention is formed from the composition for color filter according to the invention described above, and it is preferred to have on a substrate, a colored region (colored pattern) (preferably, a black region (black pattern) by using the composition for color filter (preferably, the colored radiation-sensitive composition) according to the invention.

Hereinafter, the infrared transmission filter according to the invention will be described in detail through the production method thereof (production method of the infrared transmission filter according to the invention).

As the formation method of colored pixel constituting the infrared transmission filter according to the invention, a method, for example, a method of preparing the colored radiation-sensitive composition described above and providing by a photolith method or a method of preparing the colored radiation-sensitive composition described above and providing by an inkjet method can be adopted.

Of the methods, the method of preparing the colored radiation-sensitive composition and providing by a photolith method is a preferred embodiment because a fine pattern can be easily provided in an arbitrary shape.

Hereinafter, a method of producing an infrared transmission filter for use in a solid-state imaging device by a method of preparing the colored radiation-sensitive composition and providing each colored pixel by a photolith method will be described, but the infrared transmission filter according to the invention should not be construed as being limited thereto.

The production method of the infrared transmission filter according to the invention comprising a step of providing the colored radiation-sensitive composition on a substrate to form an infrared transmission composition layer (colored layer) (a colored layer-forming step), a step of exposing patternwise the infrared transmission composition layer (an exposing step), and a step of developing the exposed infrared transmission composition layer to form a pattern (a developing step).

<Colored Layer-Forming Step>

In the colored layer-forming step, the colored radiation-sensitive composition is coated on a substrate to form a colored layer (infrared transmission composition layer) composed of the colored radiation-sensitive composition.

As the substrate which is able to use in this step, for example, a photoelectric conversion element substrate in CCD, CMOS or organic CMOS, a silicon substrate and the like, which are used in a solid-state imaging device, and alkali-free glass, soda glass, Pyrex (registered trademark) glass, quartz glass, and these glasses to which a transparent conductive film is attached and the like, which are used in liquid crystal display or the like are exemplified. In some cases, a black matrix which isolates each pixel may be formed on the substrate.

Moreover, if desired, an undercoat layer may be provided on the substrate in order to improve adhesion to the upper layer, to prevent the diffusion of substance or to planarize the substrate surface.

As to the method for coating the colored radiation-sensitive composition according to the invention on the substrate, various coating methods, for example, slit coating, an ink-jet method, spin coating, cast coating, roll coating or a screen printing method can be applied.

Drying (prebake) of the colored layer (infrared transmission composition layer) coated on the substrate can be conducted at a temperature from 50 to 140° C. for a period from 10 to 300 seconds using a hot plate, an oven or the like.

The film thickness of the colored layer after drying (prebake) is in a range from 0.55 to 1.8 µm, preferably from 0.60 to less than 1.8 µm, more from 0.70 to 1.6 µm, and particularly from 0.80 to 1.4 µm.

<Exposing Step>

In the exposing step, the colored layer (infrared transmission composition layer) formed according to the colored layer-forming step is exposed patternwise.

The exposure of the colored layer in the exposure of the step is preferably conducted by exposing through a predetermined mask pattern to cure only the colored layer portion irradiated with light. As the radiation which can be used in the exposure, in particular, radiation, for example, g-line, h-line or i-line is preferably used, and i-line is particularly preferred. The irradiation dose is preferably from 30 to 1,500 mJ/cm$^2$, more preferably from 50 to 1,000 mJ/cm$^2$, and most preferably from 80 to 500 mJ/cm$^2$.

<Developing Step>

Following the exposing step, an alkali development processing (development step) is conducted thereby dissolving out the uncured portion after the exposure while remaining the portion cured with light. By the developing step, a patternwise film composed of colored pixels can be formed.

The developing method may be any of a dip method, a shower method, a spray method, a paddle method and the like, and a swing method, a spin method, an ultrasonic method or the like may be combined therewith.

Before contacting the developer, the surface to be developed may be moisten with water or the like in advance to prevent development unevenness.

As the developer, an organic alkali developer which does not cause damage to underlying circuits and the like is desirable. The developing temperature is usually from 20 to 30° C., and the developing time is from 20 to 90 seconds.

As the alkali agent included in the developer, for instance, aqueous ammonia, an organic alkaline compound, for example, ethylamine, diethylamine, dimethylethanolamine, tetramethylammonium hydroxide, tetraethylammonium hydroxide, choline, pyrrole, piperidine or 1,8-diazabicyclo-[5,4,0]-7-undecene, and an inorganic alkaline compound, for example, sodium hydroxide, potassium hydroxide, sodium hydrogen carbonate or potassium hydrogen carbonate are exemplified.

As the developer, an aqueous alkaline solution prepared by diluting with pure water so as to have concentration of the alkali agent from 0.001 to 10% by mass, preferably from 0.01 to 1 by mass is preferably used. In the case of using the developer composed of such an aqueous alkaline solution, after the development the excess developer is ordinarily removed by washing (rinsing) with pure water and drying is conducted.

The production method according to the invention may also include a curing step in which the colored pattern formed is cured by post heating (postbake) or post exposure, if desired, after conducting the colored layer-forming step, the exposing step and the developing step described above are performed. The postbake is a heating treatment after the development in order to complete the curing, and a heat curing treatment ordinarily from 100 to 270° C. is performed.

In the case of using light, g-line, h-line, i-line, an excimer laser, for example, KrF or ArF, an electron beam, an X-ray or the like can be used, however, it is preferred to conduct using an existing high-pressure mercury lamp at a low temperature approximately from 20 to 50° C. The irradiation time is from 10 to 180 seconds, and preferably from 30 to 60 seconds. In the case of conducting the post exposure and the post heating in combination, it is preferred to conduct the post exposure first.

As described hereinbefore, an infrared transmission filter is produced by conducting the colored layer-forming step, the exposing step and the developing step (also, the curing step, if desired).

The infrared transmission filter may be composed of only colored pixels exhibiting the specific spectral characteristics according to the invention, or may be composed of a color filter including the colored pixels exhibiting the spectral characteristics described above and colored pixels of red, green, blue, magenta, yellow, cyan, black colorless and the like. In the case where the color filter is composed together with pixels of other color, the colored pixels exhibiting the specific spectral characteristics according to the invention may be provided first or later.

The colored radiation-sensitive composition according to the invention can be easily removed by cleaning using a known cleaning liquid even when the composition is adhered, for example, to a nozzle of discharge unit of coating device, to a piping unit of coating device, in a coating device or the like. In this case, in order to conduct more efficiently removal by cleaning, the organic solvent described above as the organic solvent included in the colored radiation-sensitive composition is preferably used as the cleaning liquid.

Further, cleaning liquids described, for example, in JP-A-7-128867, JP-A-7-146562, JP-A-8-278637, JP-A-2000-273370, JP-A-2006-85140, JP-A-2006-291191, JP-A-2007-2101, JP-A-2007-2102 and JP-A-2007-281523 can also be preferably used as the cleaning liquid for removal by cleaning of the colored radiation-sensitive composition according to the invention.

As the cleaning liquid, alkylene glycol monoalkyl ether carboxylate or alkylene glycol monoalkyl ether is preferably used.

The organic solvents which can be used as the cleaning liquid may be used individually or as a mixture of two or more thereof.

In the case where two or more organic solvents are mixed, a mixed solvent formed by mixing an organic solvent having a hydroxy group and an organic solvent having no hydroxy group is preferred. The mass ratio of the organic solvent having a hydroxy group and the organic solvent having no hydroxy group is from 1/99 to 99/1, preferably from 10/90 to 90/10, and more preferably from 20/80 to 80120. As the mixed solvent, a mixed solvent of propylene glycol monomethyl ether acetate (PGMEA) and propylene glycol monomethyl ether (PGME) with the ratio of 60/40 is particularly preferred.

The surfactant described above as the surfactant which the colored radiation-sensitive composition may contain may be added to the cleaning liquid in order to increase penetrating property of the cleaning liquid into the colored radiation-sensitive composition.

The infrared transmission filter according to the invention produced by the production method of the infrared transmission filter according to the invention can also be preferably mounted in a solid-state imaging device, for example, a CCD sensor, a CMOS sensor, an organic CMOS sensor or CIGS image sensor. Particularly, the infrared transmission filter is preferably mounted in a solid-state imaging device of CCD sensor, CMOS sensor or organic CMOS sensor having high resolution of more than one million pixels. The infrared transmission filter according to the invention can be disposed, for example, between a light receiving unit of each pixel consisting a CCD element and a micro-lens for light collection.

[Infrared Sensor]

The infrared sensor according to the invention is equipped with the infrared transmission filter according to the invention. The configuration of the infrared sensor according to the invention is a configuration equipped with the infrared transmission filter, and is not particularly limited as long as the configuration functions as the solid-state imaging device, and, for example, the configuration shown below is exemplified.

A configuration is exemplified wherein on a substrate are provided a plurality of photodiodes constituting a light receiving area of a solid-state imaging device (CCD sensor, CMOS sensor, organic CMOS sensor or the like) and a transfer electrode composed of polysilicon or the like are provided, on the photodiodes and the transfer electrode is provided a light-shielding film composed of a tungsten or the like in which only a light receiving unit of the photodiode is opened, on the light-shielding film is provided a device protective film composed of silicon nitride or the like which is formed so as to cover the entire surface of the light-shielding film and the light receiving unit of the photodiode, and on the device protective film is provided the infrared transmission filter according to the invention.

Moreover, a configuration having a light collecting means (for example, a micro-lens or the like, hereinafter the same) under the infrared transmission filter (the side closer to the substrate) on the device protective layer, or a configuration having the light collecting means on the infrared transmission filter may also be included.

The organic CMOS sensor is configured to include a thin film of panchromatic light-sensitive organic photoelectric conversion film as a photoelectric conversion layer and a CMOS signal read-out substrate, has a hybrid structure of two-layer configuration where an organic material plays a role to capture light to convert it to an electrical signal, and an inorganic material plays a role to extract the electrical signal outside, and in principle, can be mage the aperture ratio with respect to incident light to be 100%. The organic photoelectric conversion film is a continuous film of structure free and can be laid on the CMOS signal read-out substrate, therefore, it is suitable for pixel miniaturization without requiring a high-priced micro-fabrication process.

EXAMPLE

The invention will be described more specifically with reference to the examples, but the invention should not be construed as being limited thereto as long as the gist of the invention is not deviated. All "part" and "%" therein are mass basis unless otherwise specified.

[Preparation of Pigment Dispersion Liquid B-1]

The mixed liquid having the composition shown below was mixed and dispersed by a beads mill (a high-pressure dispersing machine equipped with a pressure-reducing mechanism, NANO-3000-10 produced by Nihon B. E. E. Co., Ltd.) using zirconia bead having a diameter of 0.3 mm until the near-infrared transmitting black pigment had an average particle size shown in Table 1 to prepare Pigment dispersion liquid B-1.

| | |
|---|---|
| Coloring agent: IRGAPHOR BK produced by BASF Corp. | 13.0 parts |
| Dispersant: Dispersing Resin 1 shown below | 5.2 parts |
| Organic solvent: Propylene glycol methyl ether acetate (PGMEA) | 81.8 parts |

[Preparation of Pigment Dispersion Liquids B-2 to B-16]

Pigment dispersion liquids B-2 to B-16 were prepared in the same manner as in [Preparation of Pigment dispersion liquid B-1] described above except for using each component shown in Table 1 in an amount shown in Table 1, respectively.

In Table 1, the numerical value shown in parentheses after each component indicates the amount of the component used (unit: parts).

In the preparation of pigment dispersion liquid which did not contain the near-infrared transmitting black pigment, a mixing time using the high-pressure dispersing machine NANO-3000-10 was 3 hours.

[Measurement of Average Particle Size of Pigment]

As to Pigment dispersion liquids B-1 to B-3, the average particle size (volume basis) of near-infrared transmitting black pigment was measured using MICROTRAC UPA 150 produced by Nikkiso Co., Ltd. The measurement results are shown in Table 1.

TABLE 1

| Pigment Dispersion Liquid | Coloring Agent | | | | | Average Particle Size (nm) | Dispersant and Related Material | | |
|---|---|---|---|---|---|---|---|---|---|
| | Near-infrared Transmitting Black Coloring Agent (A) | Coloring Agent (B) | | | | | Dispersant | Dispersion Assistant | Solvent |
| B-1 | IRGAPHOR BK (13) | | | | | 30 | Dispersing Resin 1 (5.2) | | PGMEA (81.8) |
| B-2 | IRGAPHOR BK (13) | | | | | 30 | Dispersing Resin 2 (5.2) | | PGMEA (81.8) |
| B-3 | IRGAPHOR BK (13) | | | | | 30 | Dispersing Resin 3 (5.2) | | PGMEA (81.8) |
| B-4 | | Y139 (13) | | | | — | Dispersing Resin 1 (5.2) | | PGMEA (81.8) |
| B-5 | | Y139 (3.9) | R254 (9.1) | | | — | Dispersing Resin 1 (5.2) | | PGMEA (81.8) |
| B-6 | | LUMOGEN BLACK FK 4280 (13) | | | | — | Dispersing Resin 1 (5.2) | | PGMEA (81.8) |
| B-7 | CHROMOFINE BLACK A-1103 (13) | | | | | — | Dispersing Resin 1 (5.2) | | PGMEA (81.8) |
| B-8 | | C.I. Pigment Black 31 (13) | | | | — | Dispersing Resin 1 (5.2) | | PGMEA (81.8) |
| B-9 | | C.I. Pigment Black 32 (13) | | | | — | Dispersing Resin 1 (5.2) | | PGMEA (81.8) |
| B-10 | | R254 (4.3) | Y150 (2.4) | B15:6 (3.4) | PV23 (1.0) G36 (2.4) | — | Dispersing Resin 4 (3.8) | Dispersant 1 (2.2) S12000 (0.5) | PGMEA (80) |

TABLE 1-continued

| Pigment Dispersion Liquid | Coloring Agent | | | | Average Particle Size (nm) | Dispersant and Related Material | | | |
|---|---|---|---|---|---|---|---|---|---|
| | Near-infrared Transmitting Black Coloring Agent (A) | Coloring Agent (B) | | | | Dispersant | Dispersion Assistant | Solvent | |
| B-11 | | R254 (3.8) | Y139 (5.0) | B15:6 (10.0) | PV23 (1.2) | — | Dispersing Resin 4 (6.4) | Dispersant 1 (3.4) | | PGMEA (70.2) |
| B-12 | | Carbon Black MS-10E (16.3) | | | | — | Dispersing Resin 5 (2.9) | S12000 (0.8) | PGMEA (80) |
| B-13 | | LUMOGEN BLACK FK 4280 (6.5) | | | | — | Dispersing Resin 6 (1.4) | Acrylic Resin 1 (6.7) | Derivative 1 (0.7) | PGMEA (84.7) |
| B-14 | | LUMOGEN BLACK FK 4280 (6.5) | | | | — | Dispersing Resin 1 (1.4) | Acrylic Resin 1 (6.7) | Derivative 1 (0.7) | PGMEA (84.7) |
| B-15 | | LUMOGEN BLACK FK 4281 (6.5) | | | | — | Dispersing Resin 6 (1.4) | Acrylic Resin 1 (6.7) | Derivative 1 (0.7) | PGMEA (84.7) |
| B-16 | | C. I. Pigment Black 32 (6.5) | | | | — | Dispersing Resin 6 (1.4) | Acrylic Resin 1 (6.7) | Derivative 1 (0.7) | PGMEA |

The contents of the brevity codes and abbreviations for the respective components described in the table are shown below. In Dispersing Resin1 1 and Dispersing Resin 2 shown below, the numerical value attached to each structural unit (numerical value attached to the repeating unit of the main chain) indicates a molar ratio of the structural unit. The numerical value attached to the repeating moiety of the side chain indicates the number of the repetitions of the repeating moiety.

[Near-Infrared Transmitting Black Coloring Agent (A)]
Those described above were used.
[Coloring Agent (B)]
LUMOGEN BLACK FK 4280: Black pigment produced by BASF Corp.
LUMOGEN BLACK FK 4281: Black pigment produced by BASF Corp.
Y139: C. I. Pigment Yellow 139
Y150: C. I. Pigment Yellow 150
R254: C. I. Pigment Red 254
G36: C. I. Pigment Green 36
PV23: C. I. Pigment Violet 23
B15:6: C. I. Pigment Blue 15:6
Carbon Black MS-10E: Black pigment produced by Mitsubishi Chemical Corp.

[Dispersant and Related Material]

[Chem. 25]

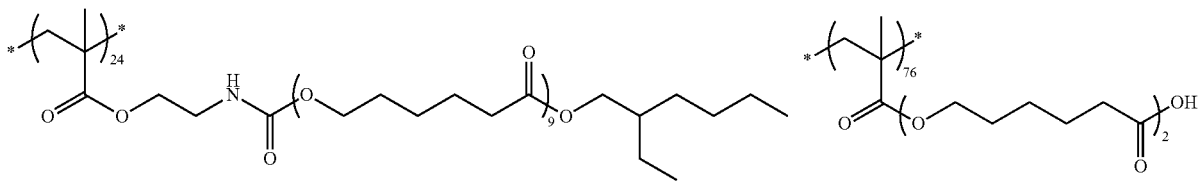

Dispersing Resin 1 (Mw: 20,000; Acid value: 77mgKOH/g)

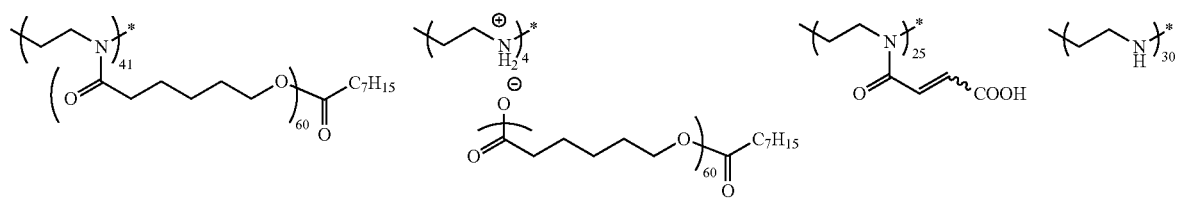

Dispersing Resin 2 (oligoimine-based resin)

Dispersing Resin 3: EFKA 4401 produced by BASF Corp. (resin having amine group)
Dispersing Resin 4: Alkali-soluble Resin-3 described in Paragraph Nos. [0172] and [0173] of JP-A-2009-69822
Dispersing Resin 5: DIPERBYK-161 produced by BYK-Chemie GmbH
Dispersing Resin 6: DIPERBYK-110 produced by BYK-Chemie GmbH
Dispersant 1: Dispersant-1 described in Paragraph No. [0175] of JP-A-2009-69822
S12000: SOLPERSE 12000 produced by Lubrizol Corp.
Acrylic Resin 1: Acrylic resin described in Paragraph No. [0083] of JP-A-2012-18384
Derivative 1: Pigment Derivative 1 described in Paragraph No. [0090] of JP-A-2012-18384

Examples 1 to 10 and Comparative Examples 1 to 6

[Preparation of Colored Radiation-Sensitive Composition]

The components described in Table 2 below were mixed in the amount described in Table 2 below to prepare the colored radiation-sensitive compositions for Examples 1 to 10 and Comparative Examples 1 to 6, respectively. The numerical value shown in Table 2 represents the amount used (unit: parts by mass) of the component.

TABLE 2

|  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Composition of Composition | Pigment Dispersion Liquid B-1 | 92.3 |  |  | 71 | 20 |  |  | 71 | 61.5 | 61.5 |
|  | Pigment Dispersion Liquid B-2 |  | 92.3 |  |  |  |  |  |  |  |  |
|  | Pigment Dispersion Liquid B-3 |  |  | 92.3 |  |  |  |  |  |  |  |
|  | Pigment Dispersion Liquid B-4 |  |  |  |  | 20 |  | 12.4 |  |  |  |
|  | Pigment Dispersion Liquid B-5 |  |  |  |  |  |  | 27.6 |  |  |  |
|  | Pigment Dispersion Liquid B-6 |  |  |  |  | 21.3 |  |  |  |  |  |
|  | Pigment Dispersion Liquid B-7 |  |  |  |  |  |  |  |  | 21.3 |  |
|  | Pigment Dispersion Liquid B-8 |  |  |  |  |  |  |  |  | 30.8 |  |
|  | Pigment Dispersion Liquid B-9 |  |  |  |  |  |  |  |  |  | 30.8 |
|  | Pigment Dispersion Liquid B-10 |  |  |  |  |  |  |  |  |  |  |
|  | Pigment Dispersion Liquid B-11 |  |  |  |  |  |  |  |  |  |  |
|  | Pigment Dispersion Liquid B-12 |  |  |  |  |  |  |  |  |  |  |
|  | Pigment Dispersion Liquid B-13 |  |  |  |  |  |  |  |  |  |  |
|  | Pigment Dispersion Liquid B-14 |  |  |  |  |  |  |  |  |  |  |
|  | Pigment Dispersion Liquid B-15 |  |  |  |  |  |  |  |  |  |  |
|  | Pigment Dispersion Liquid B-16 |  |  |  |  |  |  |  |  |  |  |
|  | Alkali-soluble Resin 1[*1] | 0.2 | 0.2 | 0.2 | 0.2 | 0.7 | 10.4 | 0.7 | 0.2 | 0.2 | 0.2 |
|  | Alkali-soluble Resin 2[*1] |  |  |  |  |  |  |  |  |  |  |
|  | Alkali-soluble Resin 3[*1] |  |  |  |  |  |  |  |  |  |  |
|  | Polymerizable Compound 1[*1] | 2 | 2 | 2 | 2 | 1 | 1.8 | 1 | 2 | 2 | 2 |
|  | Polymerizable Compound 2[*1] | 0.6 | 0.6 | 0.6 | 0.6 | 0.6 | 0.6 | 0.6 | 0.6 | 0.6 | 0.6 |
|  | Polymerizable Compound 3[*1] |  |  |  |  | 0.4 | 0.7 | 0.4 |  |  |  |
|  | Photopolymerization Initiator 1 | 0.5 | 0.5 | 0.5 | 0.5 | 0.4 | 0.7 | 0.4 | 0.5 | 0.5 | 0.5 |
|  | Photopolymerization Initiator 2 |  |  |  |  |  |  |  |  |  |  |
|  | Photopolymerization Initiator 3 |  |  |  |  |  |  |  |  |  |  |
|  | A-1 |  |  |  |  | 10 | 12 | 10 |  |  |  |
|  | Surfactant 1[*2] | 4.2 | 4.2 | 4.2 | 4.2 | 4.2 | 4.2 | 4.2 | 4.2 | 4.2 | 4.2 |
|  | Surfactant 2[*2] |  |  |  |  |  |  |  |  |  |  |
|  | Polymerizable Compound 4 |  |  |  |  |  |  |  |  |  |  |
|  | Polymerizable Compound 5 |  |  |  |  |  |  |  |  |  |  |
|  | Polymerizable Compound 6 |  |  |  |  |  |  |  |  |  |  |
|  | Polymerization Inhibitor | 0.001 | 0.001 | 0.001 | 0.001 | 0.001 | 0.001 | 0.001 | 0.001 | 0.001 | 0.001 |
|  | Organic Solvent 1 | 0.2 | 0.2 | 0.2 | 0.2 | 0.2 | 0.2 | 0.2 | 0.2 | 0.2 | 0.2 |
|  | Organic Solvent 2 |  |  |  |  |  |  |  |  |  |  |
|  | Organic Solvent 3 |  |  |  |  |  |  |  |  |  |  |

TABLE 2-continued

|  |  | Comparative Example 1 | Comparative Example 2 | Comparative Example 3 | Comparative Example 4 | Comparative Example 5 | Comparative Example 6 |
| --- | --- | --- | --- | --- | --- | --- | --- |
| Composition of Composition | Pigment Dispersion Liquid B-1 |  |  |  |  |  |  |
|  | Pigment Dispersion Liquid B-2 |  |  |  |  |  |  |
|  | Pigment Dispersion Liquid B-3 |  |  |  |  |  |  |
|  | Pigment Dispersion Liquid B-4 |  |  |  |  |  |  |
|  | Pigment Dispersion Liquid B-5 |  |  |  |  |  |  |
|  | Pigment Dispersion Liquid B-6 |  |  |  |  |  |  |
|  | Pigment Dispersion Liquid B-7 |  |  |  |  |  |  |
|  | Pigment Dispersion Liquid B-8 |  |  |  |  |  |  |
|  | Pigment Dispersion Liquid B-9 |  |  |  |  |  |  |
|  | Pigment Dispersion Liquid B-10 | 75.4 |  |  |  |  |  |
|  | Pigment Dispersion Liquid B-11 |  | 60.1 |  |  |  |  |
|  | Pigment Dispersion Liquid B-12 |  | 2.3 |  |  |  |  |
|  | Pigment Dispersion Liquid B-13 |  |  | 48 |  |  |  |
|  | Pigment Dispersion Liquid B-14 |  |  |  | 48 |  |  |
|  | Pigment Dispersion Liquid B-15 |  |  |  |  | 48 |  |
|  | Pigment Dispersion Liquid B-16 |  |  |  |  |  | 48 |
|  | Alkali-soluble Resin 1*[1] |  |  |  |  |  |  |
|  | Alkali-soluble Resin 2*[1] | 3.8 | 3.2 |  |  |  |  |
|  | Alkali-soluble Resin 3*[1] |  |  | 3.4 | 3.4 | 3.4 | 3.4 |
|  | Polymerizable Compound 1*[1] |  | 1 |  |  |  |  |
|  | Polymerizable Compound 2*[1] |  |  |  |  |  |  |
|  | Polymerizable Compound 3*[1] |  |  |  |  |  |  |
|  | Photopolymerization Initiator 1 |  |  |  |  |  |  |
|  | Photopolymerization Initiator 2 | 0.5 | 1.1 |  |  |  |  |
|  | Photopolymerization Initiator 3 |  |  | 0.4 | 0.4 | 0.4 | 0.4 |
|  | A-1 |  |  |  |  |  |  |
|  | Surfactant 1*[2] |  |  |  |  |  |  |
|  | Surfactant 2*[2] |  |  | 1 | 1 | 1 | 1 |
|  | Polymerizable Compound 4 | 1.3 |  |  |  |  |  |
|  | Polymerizable Compound 5 | 0.2 |  |  |  |  |  |
|  | Polymerizable Compound 6 |  |  | 2.9 | 2.9 | 2.9 | 2.9 |
|  | Polymerization Inhibitor | 0.001 | 0.001 | 0.001 | 0.001 | 0.001 | 0.001 |
|  | Organic Solvent 1 | 13.3 | 32.3 |  |  |  |  |
|  | Organic Solvent 2 | 5.5 |  |  |  |  |  |
|  | Organic Solvent 3 |  |  | 44.3 | 44.3 | 44.3 | 44.3 |

*[1] in terms of solid content
*[2] 1% PGMEA solution

The content of each component shown in Table 2 is described below.

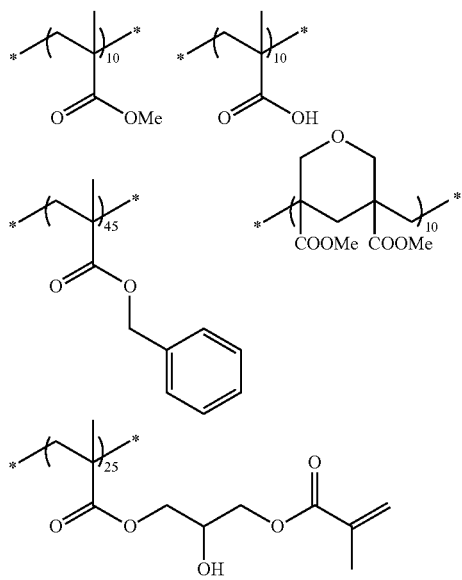

Alkali-soluble Resin 1 (ratio of repeating unit being indicated as a molar ratio)
  Mw: 11,000
Alkali-soluble Resin 2: Alkali-soluble Resin-1 (epoxyacrylate resin) described in Paragraph No. [0170] of JP-A-2009-69822

Alkali-soluble Resin 3: Acrylic resin described in Paragraph No. [0083] of JP-A-2012-18384

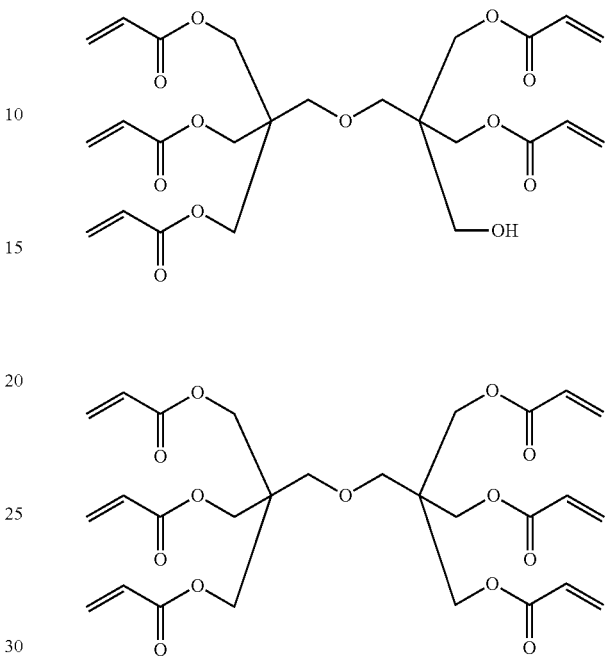

Polymerizable Compound 1 (mixture of the compound shown on the left side and the compound shown on the right side in a molar ratio of 7:3)

Polymerizable Compound 2

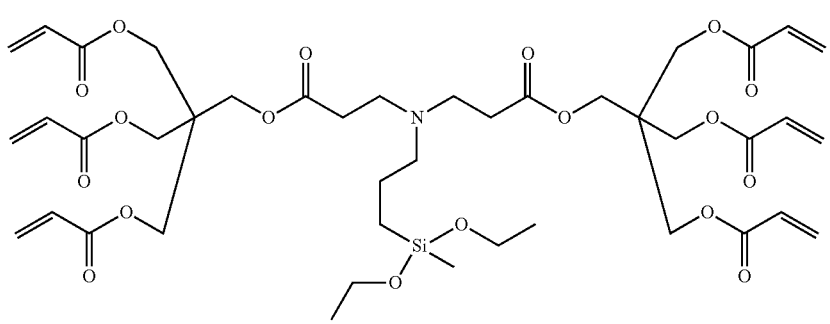

Polymerizable Compound 3

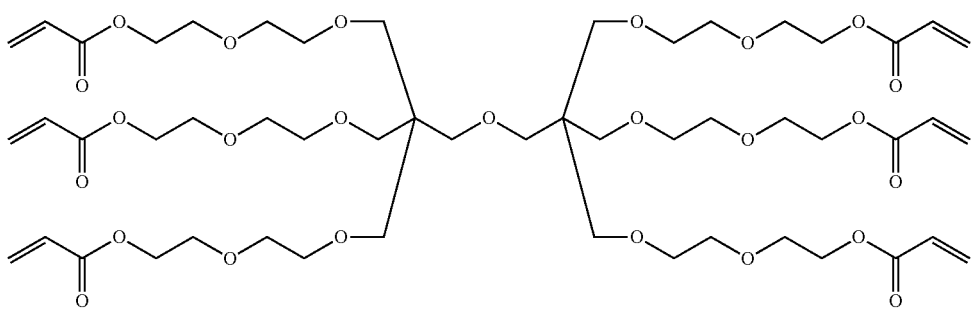

Polymerizable Compound 4: U-6LPA (urethaneacrylate) produced by Shin-Nakamura Chemical Co., Ltd.
Polymerizable Compound 5: PM-21 (2-(meth)acryloyloxyethyl caproate acid phosphate) produced by Nippon Kayaku Co., Ltd.
Polymerizable Compound 6: ARONIX M-402 produced by Toagosei Co., Ltd.
A-1 (Near-infrared transmitting black coloring agent (A)): Azo dye represented by formula (A-1) shown below

[Chem. 30]

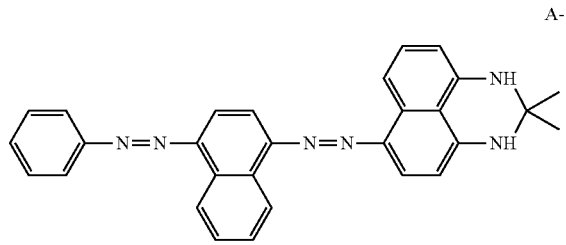

A-1

[Chem. 31]

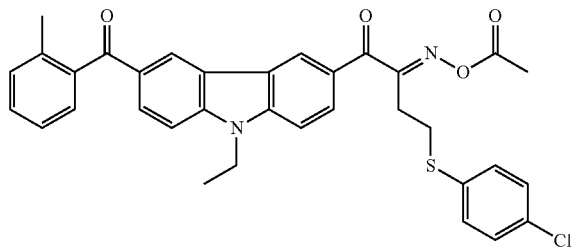

Photopolymerization Initiator 1

Photopolymerization Initiator 2: Photopolymerization Initiator-1 (oxime-based initiator) described in Paragraph No. [0177] of JP-A-2009-69822
Photopolymerization Initiator 3: IRGACURE OXE-02 produced by BASF Corp.
Surfactant 1: 1.00% by mass PGMEA solution of MEGAFAC F781F produced by DIC Corp.
Surfactant 2: 1.00% by mass PGMEA solution of BYK-330 produced by BYK-Chemie Japan KK
Polymerization Inhibitor: p-Methoxyphenol
Organic Solvent 1: Propylene glycol methyl ether acetate (PGMEA)
Organic Solvent 2: 3-Methoxybutyl acetate
Organic Solvent 3: Cyclohexanone Using each of the colored radiation-sensitive compositions obtained, the spectral characteristics were measured. The results are collectively shown in Table 3.

[Spectral Characteristics]

Each colored radiation-sensitive composition was spin-coated on a glass substrate so as to have a film thickness after postbake of 0.5 μm, dried on a hot plate at 100° C. for 120 seconds, and then further subjected to heating treatment (postbake) using a hot plate of 200° C. for 300 seconds.

The light transmittance of the substrate having the colored layer in a wavelength range from 300 to 1,300 nm was measured using a spectrophotometer (UV-Visible/NIR Spectrophotometer U-4100 produced by Hitachi High-Technologies Corp.) (ref: glass plate).

(Infrared Ray Transmittance)

The minimum value $X_{min}$ of the light transmittance in a wavelength range from 800 to 1,300 nm was determined according to the measurement method described in [Spectral characteristics] above and evaluated based on the evaluation criteria shown below.

<Evaluation Criteria>

A: $80\% \leq X$

B: $X_{min} < 80\%$ (Visible Light Transmittance)

The maximum value $Y_{max}$ of the light transmittance in a wavelength range from 400 to 650 nm was determined according to the measurement method described in [Spectral characteristics] above and evaluated based on the evaluation criteria shown below.

<Evaluation Criteria>

A: $Y_{max} \leq 20\%$

B: $20\% < Y_{max}$

In the colored radiation-sensitive compositions of Examples 1 to 3 and 6, the concentration of the near-infrared transmitting black coloring agent to the total solid content of the composition for color filter (therefore, film formed) was 60% by mass.

Also, in any of the cases wherein IRGAPHOR BK used in Example 1 was substituted with each of LUMOGEN BLACK FK4280, LUMOGEN BLACK FK4281, Carbon Black MS-10E, C. I. Pigment Black 31 and C. I. Pigment Black 32 used in the comparative examples (the amount used was same as that of IRGAPHOR BK in Example 1), the maximum value $Y_{max}$ of the light transmittance in a wavelength range from 400 to 650 nm exceeded 30%.

(Visible Light Absorbance)

The average value $Z_{ave}$ of the absorbance in a wavelength range from 400 to 630 nm was determined according to the measurement method described in [Spectral characteristics] above and evaluated based on the evaluation criteria shown below. As the grade is higher, the visible light absorbance is higher and the property is more excellent.

<Evaluation Criteria>

5: $0.90 \leq Z_{ave}$

4: $0.80 \leq Z_{ave} < 0.90$

3: $0.75 \leq Z_{ave} < 0.80$

2: $0.70 \leq Z_{ave} < 0.75$

1: $Z_{ave} < 0.70$ (Visible Light Flatness)

The standard deviation σ of the light transmittance in a wavelength range from 400 to 630 nm was determined according to the measurement method described in [Spectral characteristics] above and evaluated based on the evaluation criteria shown below. As the grade is higher, the standard deviation is smaller and the property is more excellent. The standard deviation a can be easily calculated from the data of light transmittance in a wavelength range from 400 to 630 nm by a well-known calculation software or the like.

<Evaluation Criteria>

5: $1.0 < \sigma \leq 2.0$

4: $2.0 < \sigma \leq 3.0$

3: $3.0 < \sigma \leq 6.0$

2: $6.0 < \sigma \leq 10.0$

1: $10.0 < \sigma$

The results obtained are shown in Table 3.

TABLE 3

| | Infrared Ray Transmittance | Visible Light Transmittance | Visible Light Absorbance | Evaluation | Visible Light Flatness | Evaluation |
|---|---|---|---|---|---|---|
| Example 1 | A | A | 0.94 | 5 | 2.8 | 4 |
| Example 2 | A | A | 0.90 | 5 | 2.8 | 4 |
| Example 3 | A | A | 0.91 | 5 | 2.8 | 4 |
| Example 4 | A | A | 0.92 | 5 | 1.8 | 5 |
| Example 5 | A | A | 1.40 | 5 | 1.8 | 5 |
| Example 6 | A | A | 1.08 | 5 | 5.9 | 3 |
| Example 7 | A | A | 1.43 | 5 | 1.2 | 5 |
| Example 8 | A | A | 0.88 | 4 | 2.4 | 4 |
| Example 9 | A | A | 0.79 | 3 | 3.3 | 3 |
| Example 10 | A | A | 0.78 | 3 | 3.4 | 3 |
| Comparative Example 1 | A | B | 0.51 | 1 | 6.2 | 2 |
| Comparative Example 2 | B | B | 0.62 | 1 | 9.8 | 2 |
| Comparative Example 3 | A | B | 0.74 | 2 | 11.9 | 1 |
| Comparative Example 4 | B | B | 0.78 | 3 | 11.3 | 1 |
| Comparative Example 5 | B | B | 0.73 | 2 | 11.9 | 1 |
| Comparative Example 6 | B | B | 0.67 | 1 | 8 | 2 |

The infrared transmission filters of the examples formed from the colored radiation-sensitive compositions of the examples exhibited the high infrared ray transmittance, the low visible light transmittance and the high visible light absorbance in comparison with the infrared transmission filters of the comparative examples formed from the colored radiation-sensitive compositions of the comparative examples.

Therefore, it was understood that the colored radiation-sensitive composition of the example is able to transmit an infrared ray (particularly a near infrared ray) in the state of low noise derived from the visible light component.

Also, in the examples in which the near-infrared transmitting black coloring agent was used in combination with the suitable coloring agent so as to compensate for the area of low absorbance, the visible light flatness was more improved.

[Production of Infrared Transmission Filter]

Each of the colored radiation-sensitive compositions of Examples 1 to 10 was coated on a silicon wafer using a spin coater so as to have a film thickness after drying of 0.5 µm, and subjected to heating treatment (prebake) using a hot plate of 100° C. for 120 seconds.

Then, exposure was conducted by an i-line stepper exposure device (FPA-3000i5+ produced by Canon Inc.) using a photomask for forming a square pixel pattern of 1.4 µm square from 50 to 750 mJ/cm² in a 50 mJ/cm² step to determine the optimum exposure amount for resolving the square pixel pattern described above, and the coated film was exposed in the optimum exposure amount.

Thereafter, the silicon wafer having the exposed coated film formed was mounted on a horizontal rotating table of a spin-shower developing machine (DW-30 Type produced by Chemitronics Co., Ltd.), and subjected to a paddle development at 23° C. for 60 seconds using CD-2060 (produced by FUJIFILM Electronic Materials Co., Ltd.) to form a colored pattern on the silicon wafer.

The silicon wafer on which a colored pattern had been formed was subjected to rinse treatment with pure water and then spray-dried.

Further, heating treatment (postbake) was conducted for 300 seconds using a hot plate of 200° C., thereby obtaining the silicon wafers having the colored pattern as the infrared transmission filters of Examples 1 to 10, respectively.

The infrared transmission filters of Examples 1 to 10 formed as described above exhibited the high infrared ray transmittance, the low visible light transmittance and the high visible light absorbance.

Therefore, it was understood that according to the composition for color filter of the invention, an infrared transmission filter which is able to transmit an infrared ray (particularly, a near infrared ray) in the state of low noise derived from the visible light component even when it has a very thin thickness (for example, thickness of 0.5 µm) can be obtained.

INDUSTRIAL APPLICABILITY

According to the invention, a composition for color filter capable of forming an infrared transmission filter which is able to transmit an infrared ray (particularly, a near infrared ray) in the state of low noise derived from the visible light component even when it has a very thin thickness (for example, thickness of 0.5 µm), and an infrared transmission filter and a production method of an infrared transmission filter using the same, and an infrared sensor can be provided.

Although the invention has been described in detail and by reference to specific embodiments, it is apparent to those skilled in the art that it is possible to add various alterations and modifications insofar as the alterations and modifications do not deviate from the spirit and the scope of the invention.

This application is based on a Japanese patent application filed on Dec. 27, 2012 (Japanese Patent Application No. 2012-286367), and the contents thereof are incorporated herein by reference.

The invention claimed is:

1. A composition for infrared transmission filter containing a near-infrared transmitting black coloring agent,
wherein the near-infrared transmitting black coloring agent is a near-infrared transmitting black coloring agent consisting of a bisbenzofuranone-based pigment, the content of the near-infrared transmitting black coloring agent is from 20 to 80% by mass, based on the total solids content of the composition for infrared transmission filter, the composition for infrared transmission filter further contains a coloring agent which is different from the near-infrared transmitting black coloring agent, the coloring agent is one or more selected from an organic pigment, and the content of the coloring agent is from 1 to 30% by mass, based on the total solids content of the composition for infrared transmission filter.

2. The composition for infrared transmission filter as claimed in claim 1,
wherein the content of the near-infrared transmitting black coloring agent is from 40 to 80% by mass, based on the total solids content of the composition for infrared transmission filter.

3. The composition for infrared transmission filter as claimed in claim 1,
wherein the average particle size of the near-infrared transmitting black pigment is 50 nm or less.

4. The composition for infrared transmission filter as claimed in claim 1,
wherein the coloring agent is a yellow pigment.

5. The composition for infrared transmission filter as claimed in claim 4,
wherein the yellow pigment is C. I. Pigment Yellow 139.

6. The composition for infrared transmission filter as claimed in claim 1,
wherein the coloring agent contains two kinds of the organic pigments.

7. The composition for infrared transmission filter as claimed in claim 1, which further contains a polymer dispersant, and the polymer dispersant is one or more selected from the group consisting of a resin having an acid value of 60 mgKOH/g or more, a resin containing an amine group and an oligoimine-based resin.

8. The composition for infrared transmission filter as claimed in claim 1, which further contains a polymerizable compound.

9. The composition for infrared transmission filter as claimed in claim 8,
wherein the polymerizable compound is one or more selected from the group consisting of radical polymerizable monomers represented by formulae (MO-1) to (MO-5):

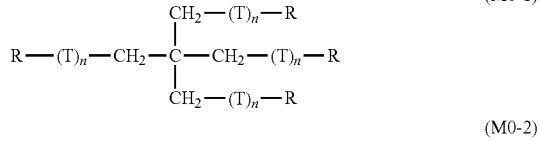
(MO-1)

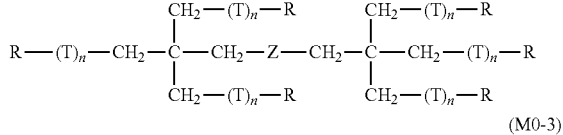
(MO-2)

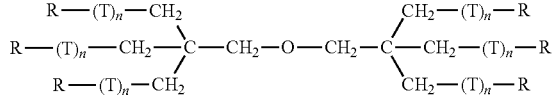
(MO-3)

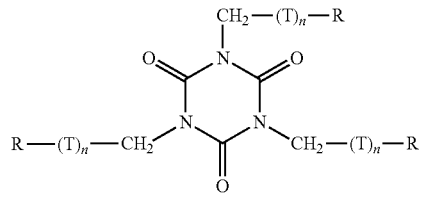
(MO-4)

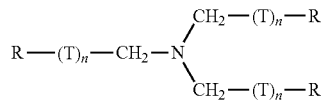
(MO-5)

R:

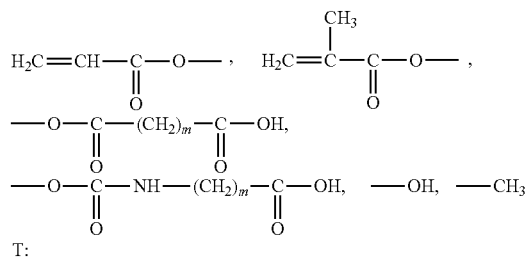

T:

$*—(CH_2)_m—*$, $—OCH_2—$, $—OCH_2CH_2—$,
$—OCH_2CH_2CH_2—$, $—OCH_2CH_2CH_2CH_2—$,
$—O(CO)—(CH_2)_m—$, $—COO—(CH_2)_m—$,
$—OCH(CH_3)—CH_2—$, $—OCH_2CH(CH_3)—$

Z:

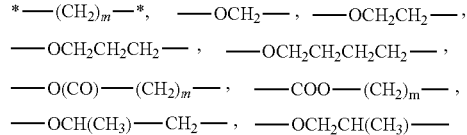

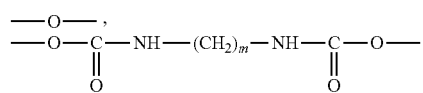

in the formulae above, n is from 0 to 14 and m is from 1 to 8, when plural Rs or plural Ts are present in one molecule, plural Rs or plural Ts may be the same or different from each other, when T is an oxyalkylene group, the terminal on the carbon atom side thereof is connected to R, in each of the polymerizable compounds represented by formulae (MO-1) to (MO-5), at least one of plural Rs represents a group represented by —OC(=O)CH=CH$_2$ or —OC(=O)C(CH$_3$)=CH$_2$.

10. The composition for infrared transmission filter as claimed in claim 8,
wherein the content of the polymerizable compound is from 2 to 25% by mass, based on the total solids content of the composition for infrared transmission filter.

11. The composition for infrared transmission filter as claimed in claim 1, which further contains a photopolymerization initiator.

12. The composition for infrared transmission filter as claimed in claim 1, which further contains an alkali-soluble resin.

13. The composition for infrared transmission filter as claimed in claim 12,
wherein the content of the alkali-soluble resin is from 1 to 15% by mass, based on the total solids content of the composition for infrared transmission filter.

14. The composition for infrared transmission filter as claimed in claim 13, wherein the content of the alkali-soluble resin is from 3 to 10% by mass, based on the total solids content of the composition for infrared transmission filter.

15. The composition for infrared transmission filter as claimed in claim 1, which further contains a surfactant.

16. The composition for infrared transmission filter as claimed in claim 15,
wherein the surfactant is a fluorine-based surfactant.

17. The composition for infrared transmission filter as claimed in claim 1,
wherein when a film having a film thickness of 0.5 μm is formed, the standard deviation of the light transmittance in the film thickness direction in a wavelength range from 400 to 630 nm is 6.0 or less.

18. The composition for infrared transmission filter as claimed in claim 1,
wherein when a film having a film thickness of 0.5 μm is formed, the maximum value of the light transmittance in the film thickness direction in a wavelength range from 400 to 650 nm is 20% or less and the minimum value of the light transmittance in the film thickness direction in a wavelength range from 800 to 1,300 nm is 80% or more.

19. An infrared transmission filter formed from the composition for infrared transmission filter as claimed in claim 1.

20. A production method of infrared transmission filter comprising:
a step of providing the composition for infrared transmission filter as claimed in claim 1 on a substrate to form an infrared transmission composition layer,
a step of exposing patternwise the infrared transmission composition layer, and
a step of developing the exposed infrared transmission composition layer to form a pattern.

21. An infrared sensor comprising the infrared transmission filter as claimed in claim 19.

* * * * *